(12) United States Patent
Suzuki et al.

(10) Patent No.: US 7,821,085 B2
(45) Date of Patent: Oct. 26, 2010

(54) PHYSICAL QUANTITY SENSOR AND METHOD FOR MANUFACTURING THE SAME

(75) Inventors: Shigenori Suzuki, Toyoake (JP); Hisanori Yokura, Obu (JP); Kenichi Yokoyama, Nagoya (JP); Tetsuo Fujii, Toyohashi (JP); Kazuhiko Sugiura, Nagoya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 12/385,848

(22) Filed: Apr. 21, 2009

(65) Prior Publication Data

US 2009/0261430 A1  Oct. 22, 2009

(30) Foreign Application Priority Data

Apr. 22, 2008 (JP) ............................. 2008-111280
Jan. 22, 2009 (JP) ............................. 2009-011903

(51) Int. Cl.
*H01L 27/14* (2006.01)
*H01L 29/82* (2006.01)
*H01L 29/84* (2006.01)

(52) U.S. Cl. .................. 257/417; 257/414; 257/415; 257/418; 257/419; 257/420; 257/E29.324

(58) Field of Classification Search ......... 257/414–415, 257/417–420, E29.324
See application file for complete search history.

(56) References Cited

U.S. PATENT DOCUMENTS

| | | | | |
|---|---|---|---|---|
| 5,561,248 A | | 10/1996 | Negoro | 73/514.32 |
| 5,987,989 A | * | 11/1999 | Yamamoto et al. | 73/514.24 |
| 6,019,728 A | * | 2/2000 | Iwata et al. | 600/486 |
| 6,250,165 B1 | * | 6/2001 | Sakai et al. | 73/754 |
| 6,255,741 B1 | * | 7/2001 | Yoshihara et al. | 257/792 |
| 6,979,873 B2 | | 12/2005 | Fujii | 257/417 |
| 7,272,974 B2 | * | 9/2007 | Goto | 73/514.32 |
| 7,466,000 B2 | * | 12/2008 | Fujii | 257/417 |
| 7,615,832 B2 | * | 11/2009 | Kondoh et al. | 257/414 |
| 2005/0061075 A1 | | 3/2005 | Sugiura | 73/514.32 |
| 2006/0048572 A1 | * | 3/2006 | Isogai et al. | 73/335.04 |
| 2007/0176249 A1 | * | 8/2007 | Meshii et al. | 257/415 |
| 2007/0217473 A1 | * | 9/2007 | Abe et al. | 372/50.124 |
| 2008/0099862 A1 | * | 5/2008 | Fujii et al. | 257/417 |
| 2008/0290490 A1 | * | 11/2008 | Fujii et al. | 257/684 |
| 2009/0229370 A1 | * | 9/2009 | Fujii et al. | 73/780 |

FOREIGN PATENT DOCUMENTS

| | | |
|---|---|---|
| JP | A-2000-187040 | 7/2000 |
| JP | A-2001-174265 | 6/2001 |
| JP | A-2005-083917 | 3/2005 |

* cited by examiner

*Primary Examiner*—Ida M Soward
(74) *Attorney, Agent, or Firm*—Posz Law Group, PLC

(57) ABSTRACT

A physical quantity sensor includes: a sensor substrate including a first support substrate, a first insulation film and a first semiconductor layer, which are stacked in this order; a cap substrate including a second support substrate disposed on the first semiconductor layer, and has a P conductive type; and multiple electrodes, which are separated from each other. The first support substrate, the first insulation film and the first semiconductor layer have the P conductive type. The physical quantity is detected based on a capacitance between the plurality of electrodes, and the electrodes are disposed in the first semiconductor layer.

12 Claims, 29 Drawing Sheets

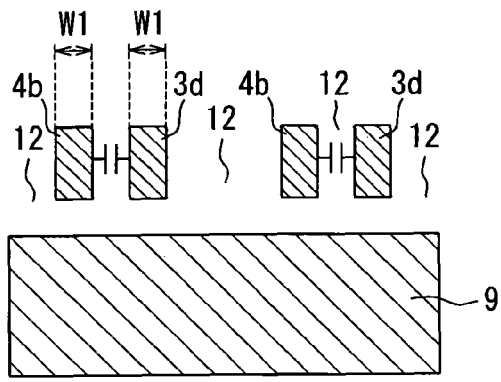
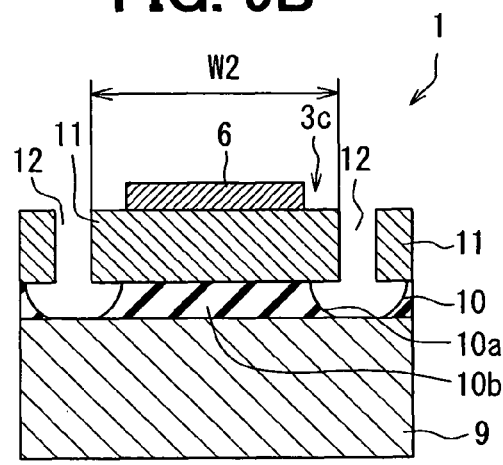
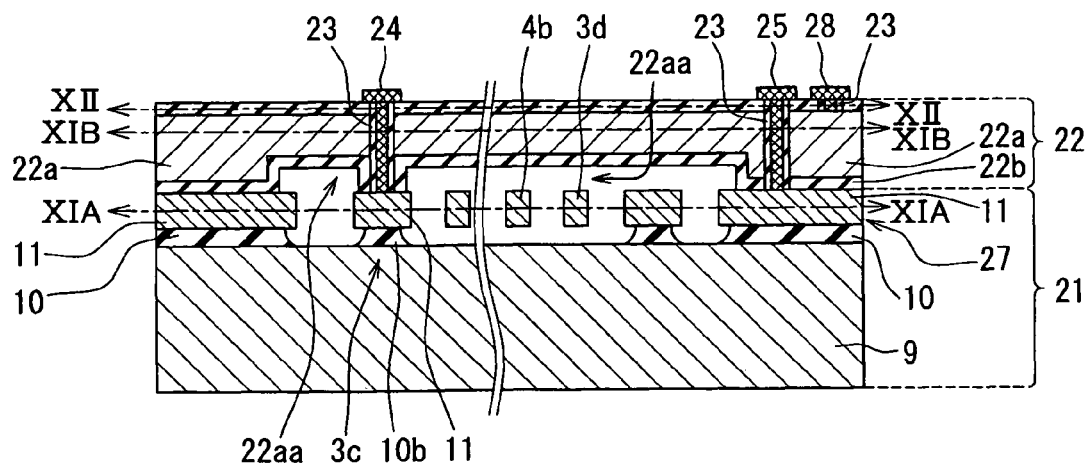

PHYSICAL QUANTITY SENSOR AND METHOD FOR MANUFACTURING THE SAME

CROSS REFERENCE TO RELATED APPLICATIONS

This application is based on Japanese Patent Applications No. 2008-111280 filed on Apr. 22, 2008, and No. 2009-11903 filed on Jan. 22, 2009, the disclosures of which are incorporated herein by reference.

FIELD OF THE INVENTION

The present invention relates to a physical quantity sensor and a method for manufacturing a physical quantity sensor.

BACKGROUND OF THE INVENTION

A physical quantity sensor such as an acceleration sensor and a yaw rate sensor detects physical quantity based on capacitance change.

The acceleration sensor for detecting acceleration of an mobile object such as a vehicle is disclosed in JP-A-H06-88837 corresponding to U.S. Pat. No. 5,561,248. The sensor includes a pair of electrodes, which are spaced apart from each other, so that the sensor detects the acceleration according to capacitance change between the electrodes.

The sensor is made of SOI substrate having a N conductive type and a low resistivity and made of silicon. The resistivity of the substrate is 10 m [Ω·cm], which is equal to 0.01 [Ω·cm]. The SOI substrate provides an upper substrate. An electrode for retrieving a wiring is disposed on an upper side of the SOI substrate. The electrode is made of, for example, conductive alloy such as gold and titanium. Thus, the upper side of the substrate is connected to a circuit for detecting capacitance via a lead wire. JP-A-2004-311951 teaches that the substrate may be made of silicon wafer having a P conductive type impurity such as boron.

However, the present inventors study that stress may be concentrated at an interface between a semiconductor layer and an insulation film when the electrode for detecting a capacitance is formed in the semiconductor layer via the insulation film having a doped N conductive type impurity. Thus, characteristics of the device may be reduced.

In the device in JP-A-H06-88837, since the N conductive type substrate is used, resistivity range of the device having no diffusion layer becomes narrow. Thus, it is required to improve the characteristics of the device without the diffusion layer and to improve mechanical reliability of the device by reducing the stress concentration at the interface between the semiconductor layer and the insulation film.

SUMMARY OF THE INVENTION

In view of the above-described problem, it is an object of the present disclosure to provide a physical quantity sensor. It is another object of the present disclosure to provide a method for manufacturing a physical quantity sensor.

According to a first aspect of the present disclosure, a physical quantity sensor includes: a sensor substrate including a first support substrate, a first insulation film and a first semiconductor layer, which are stacked in this order, wherein the first support substrate has a P conductive type impurity doped therein, the first insulation film has a P conductive type impurity doped therein, and the first semiconductor layer has a P conductive type impurity doped therein; a cap substrate including a second support substrate, which is disposed on the first semiconductor layer, and has a P conductive type impurity doped therein; and a plurality of electrodes, which are separated from each other. The physical quantity is detected based on a capacitance between the plurality of electrodes, and the plurality of electrodes is disposed in the first semiconductor layer.

The above sensor has wide resistivity without a diffusion layer so that the sensor can detect the physical quantity with high accuracy.

According to a second aspect of the present disclosure, a physical quantity sensor includes: a support substrate; an insulation film disposed on the support substrate; a first electrode, which is movable, and disposed over the support substrate; and a second electrode disposed on the insulation film. The insulation film has a P conductive type impurity doped therein. The insulation film includes a sidewall, which is curved downwardly. The insulation film has a width along with a direction parallel to the support substrate. The width of the insulation film becomes narrower as it goes from the support substrate to the second electrode. The first electrode is made of P conductive type silicon. The first electrode and the second electrode are separated from each other, and the physical quantity is detected based on a capacitance between the first electrode and the second electrode. In the sensor, stress concentration is reduced, so that mechanical reliability is improved. Further, distortion ratio in accordance with temperature change is improved.

According to a third aspect of the present disclosure, a method for manufacturing a physical quantity sensor includes: forming a sensor substrate including a first support substrate, a first insulation film and a first semiconductor layer, which are stacked in this order, wherein the first support substrate has a P conductive type impurity doped therein, the first insulation film has a P conductive type impurity doped therein, and the first semiconductor layer has a P conductive type impurity doped therein; forming a cap substrate including a second support substrate, which is disposed on the first semiconductor layer, and has a P conductive type impurity doped therein; and forming a plurality of electrodes in the first semiconductor layer. The plurality of electrodes are separated from each other, and the physical quantity is detected based on a capacitance between the plurality of electrodes. In this case, the above sensor has wide resistivity without a diffusion layer so that the sensor can detect the physical quantity with high accuracy. Further, the manufacturing method is simplified.

According to a fourth aspect of the present disclosure, a method for manufacturing a physical quantity sensor includes: forming an insulation film on a support substrate, wherein the insulation film has a P conductive type impurity doped therein; forming a semiconductor layer on the insulation film so that a sensor substrate is formed; dividing the semiconductor layer into a plurality of parts with a hole so that the insulation film is exposed from the semiconductor layer via the hole, wherein the plurality of parts include a first electrode having a first width and a second electrode having a second width, which is wider than the first width; and isotropically etching the insulation film via the opening so that the insulation film under the first electrode is removed, and the insulation film under the second electrode is partially removed. The physical quantity is detected based on a capacitance between the first electrode and the second electrode. The insulation film under the second electrode includes a support portion for supporting the second electrode on the support substrate, and a part of the insulation film adjacent to the support portion is removed in the isotropically etching the insulation film. In the sensor, stress concentration is reduced, so that mechanical reliability is improved. Further, distortion ratio in accordance with temperature change is improved.

BRIEF DESCRIPTION OF THE DRAWINGS

The above and other objects, features and advantages of the present invention will become more apparent from the following detailed description made with reference to the accompanying drawings. In the drawings:

FIG. 9A is a cross sectional view showing the sensor taken along line VIA-VIA in FIG. 1, and FIG. 9B is a cross sectional view showing the sensor taken along line VIB-VIB in FIG. 1;

FIG. 10 is a cross sectional view showing a physical quantity sensor having a cap substrate and a sensor substrate according to a second embodiment;

DETAILED DESCRIPTION OF THE PREFERRED EMBODIMENTS

First Embodiment

A physical quantity sensor according to a first embodiment is a capacitive semiconductor acceleration sensor 300 for detecting collision of a vehicle to control an air bag system.

Figure 1:
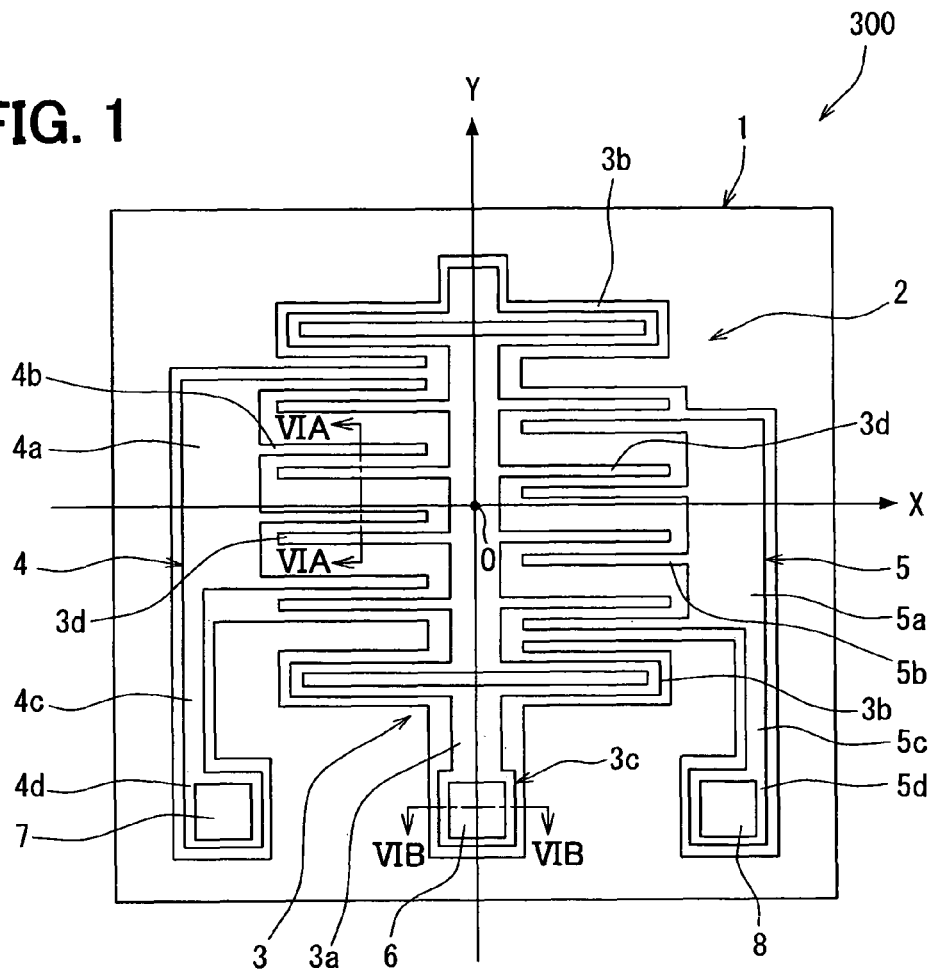
FIG. 1 is a plan view showing a physical quantity sensor according to a first embodiment.

FIG. 1 shows an acceleration detection unit in the sensor 300. The sensor 300 includes a sensor chip 1, which detects acceleration along with a Y-axis in FIG. 1. The sensor chip 1 is a uniaxial sensor having a detection axis of the Y-axis. The sensor chip 1 includes an acceleration detection unit 2 as a physical quantity detection unit. The acceleration detection unit 2 has a center O as an original point. The Y-axis corresponds to a front-rear direction, and a X-axis-corresponds to a right-left direction perpendicular to the Y-axis.

The detection unit 2 includes a movable unit 3 and a pair of fixed units 4, 5. The movable unit 3 is movable along with the Y-axis according to the acceleration applied to the sensor 300. The movable unit 3 includes a weight portion 3a, a beam portion 3b and an anchor portion 3c. The weight portion 3a extends along with the Y-axis from the center O of the detection unit 2. The beam portion 3b has a rectangular rim shape elongated in the X-axis. The beam portion 3b is disposed on both sides of the weight portion 3a. The anchor portion 3c is disposed on a down side of the beam portion 3b in FIG. 1. Further, the movable unit 3 includes a movable electrode 3d having comb-teeth, each of which extends from one side of the weight portion 3a along with the X-axis. Thus, the electrode 3d includes multiple narrow width teeth.

A first electrode pad 6 is arranged on the upper surface of the anchor portion 3c. An insulation film 10 under the movable unit 3 other than the anchor portion 3c in a Z-axis perpendicular to the X-axis and Y-axis is removed. Only the anchor portion 3c is supported on a support substrate 9. Thus, the movable unit 3 is separated from the substrate 9 so that the movable unit 3 provides a cantilever.

The left side fixed unit 4 includes a fixed electrode 4b having comb-teeth, each of which extends from a right side of a base portion 4a along with the X-axis. Thus, the electrode 4b includes multiple narrow width teeth. The base portion 4a has a rectangular shape and is disposed on a left side of the center O. The fixed electrode 4b extends in parallel to the movable electrode 3d, and is separated from the movable electrode 3d by a predetermined clearance therebetween. Thus, the fixed electrode 4b and the movable electrode 3d are adjacently arranged in the Y-axis. A fixed electrode wiring portion 4c extends from the base portion 4a in the Y-axis. The wiring portion 4c has an end portion 4d, on which an electrode pad 7 is arranged.

The right side fixed unit 5 includes a fixed electrode 5b having comb-teeth, each of which extends from a left side of a base portion 5a along with the X-axis. Thus, the electrode 5b includes multiple narrow width teeth. The base portion 5a has a rectangular shape and is disposed on a right side of the center O. The fixed electrode 5b extends in parallel to the movable electrode 3d, and is separated from the movable electrode 3d by a predetermined clearance therebetween. Thus, the fixed electrode 5b and the movable electrode 3d are adjacently arranged in the Y-axis. A fixed electrode wiring portion 5c extends from the base portion 5a in the Y-axis. The wiring portion 5c has an end portion 5d, on which an electrode pad 8 is arranged.

The insulation film 10 under the fixed units 4, 5 other than the base portions 4a, 5a and the end portions 4d, 5d is removed. Thus, only the base portions 4a, 5a and the end portions 4d, 5d are supported on the support substrate 9. Thus, the fixed units 4, 5 provide cantilevers so that the fixed units 4, 5 other than the base portions 4a, 5a and the end portions 4d, 5d are separated from the substrate 9. Each electrode pad 6-8 has a predetermined shape such as a circular shape and a square shape, and is made of aluminum.

A capacitor is formed between the movable electrode 3d and the fixed electrode 4b. Further, another capacitor is formed between the movable electrode 3d and the fixed electrode 5d. The capacitance of each capacitor is differentially changed in accordance with displacement of the movable electrode 3d when the acceleration in the Y-axis is applied to the sensor 300. The acceleration is detected based on the capacitance change. The detection unit 2 includes a capacitance-voltage converter, a filter, a signal amplifier and the like so that the unit 2 converts the capacitance change to a voltage change, and amplifies the voltage change to a certain output signal. Thus, the sensor can detect the acceleration as a physical quantity.

FIG. 9A shows arrangement of the movable electrode 3d and the fixed electrode 4b in the sensor 300 taken along line VIA-VIA in FIG. 1. FIG. 9B shows a structure around the anchor 3c in the sensor 300 taken along line VIB-VIB in FIG. 1.

The sensor chip 1 is made of a SOI substrate having the support substrate 9, an oxide film 10 and a single crystal silicon layer 11, which are stacked in this order. The support substrate 9 is made of single crystal silicon having a P conductive type. The oxide film 10 as the insulation film is sandwiched between the substrate 9 and the silicon layer 11. The silicon layer 11 has the P conductive type. A groove 12 is formed in the silicon layer 11 and the oxide film 10 by using a micro machining technique. The SOI substrate has a rectangular shape or a square shape. The oxide film 10 has a thickness in a range between 0.5 µm and 5.0 µm. It is preferable to use thick oxide film 10 for reducing a parasitic capacitance.

In FIG. 9A, the fixed electrode 4b and the movable electrode 3d are formed over the substrate 9 such that the fixed electrode 4b and the movable electrode 3d are spaced apart from the substrate 9. Each electrode 3d, 4b has a comparatively narrow first width W1 along with the Y-axis.

In FIG. 9B, a support portion 10b of the oxide film 10 is formed on the substrate 9. The oxide film 10 includes a P conductive type impurity such as boron. The silicon layer 11 having the P conductive type impurity such as boron is formed on the support portion 10b. The electrode pad 6 made of aluminum is formed on the silicon layer 11. The support portion 10b has a side wall 10a, which is curved and concaved downward. The silicon layer 11 has a second width W2 along with the X-axis. The second width W2, is larger than the first width W1.

A manufacturing method of the sensor 300 will be explained as follows.

Figure 6A:
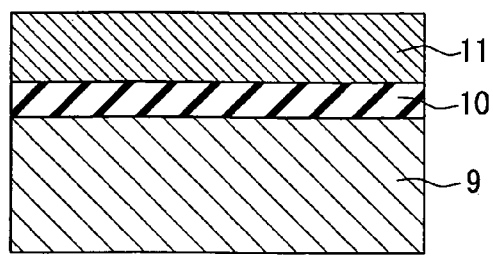
FIG. 6A is a cross sectional view showing a manufacturing method of the sensor taken along line VIA-VIA in FIG. 1.
Figure 6B:
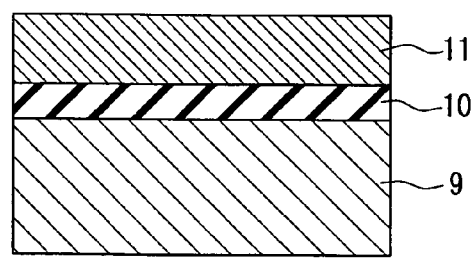
FIG. 6B is a cross sectional view showing the manufacturing method of the sensor taken along line VIB-VIB in FIG. 1.

FIGS. 6A to 8B correspond to FIGS. 9A and 9B, respectively. FIGS. 6A to 8b show the sensor 300 during the production process. Firstly, as shown in FIGS. 6A and 6B, the P conductive type silicon layer 11 is bonded to the support substrate 9 made of P conductive type single crystal silicon via the oxide film 10. Thus, the SOI substrate is formed. The oxide film 10 including the P conductive type impurity such as boron is formed on the substrate 9. The impurity concentration of the oxide film 10 is higher than an oxide film including a N conductive type impurity such as phosphorous.

Figure 7A:
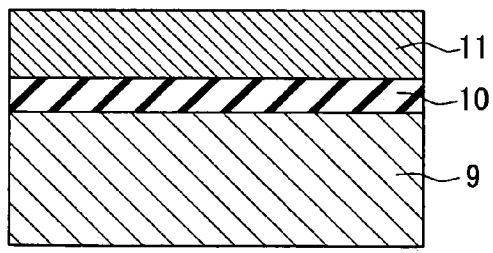
FIG. 7A is a cross sectional view showing the manufacturing method of the sensor taken along line VIA-VIA in FIG. 1.
Figure 7B:
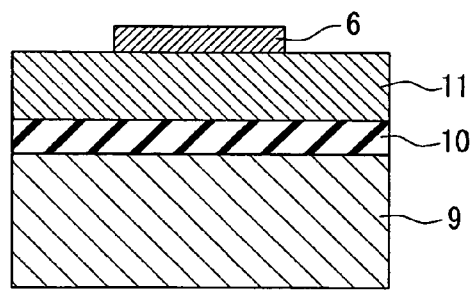
FIG. 7B is a cross sectional view showing the manufacturing method of the sensor taken along line VIB-VIB in FIG. 1.

Next, as shown in FIGS. 7A and 7B, an aluminum film is formed on the silicon layer 11 by a vapor deposition method or a sputtering method. Then, a mask made of photo resist or an oxide film is formed on the aluminum film, and the mask is patterned. Then, the aluminum film is patterned by a wet etching method or the like. Thus, the aluminum film provides the electrode pad 6. This step for forming the electrode pad 6 does not roughen the surface of the SOI substrate. Accordingly, variation of performance of the sensor 300 is reduced.

Figure 8A:
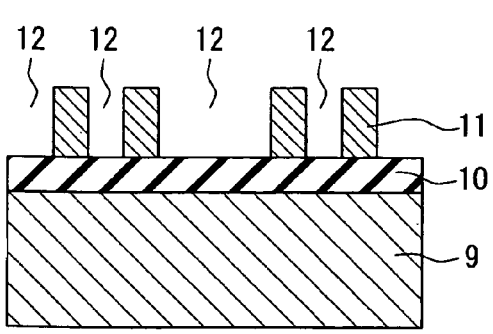
FIG. 8A is a cross sectional view showing the manufacturing method of the sensor taken along line VIA-VIA in FIG. 1.
Figure 8B:
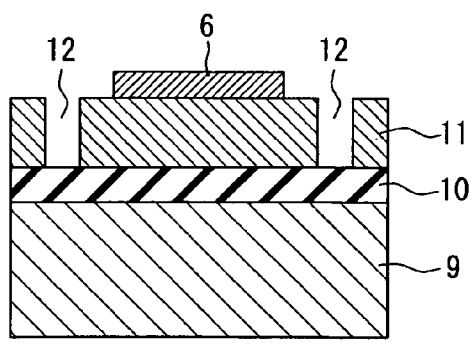
FIG. 8B is a cross sectional view showing the manufacturing method of the sensor taken along line VIB-VIB in FIG. 1.

Then, as shown in FIGS. 8A and 8B, the silicon layer 11 is patterned by an anisotropic etching method so that the groove 12 is formed in the silicon layer 11. The groove 12 reaches the surface of the oxide film 10. As shown in FIGS. 9A and 9B, the oxide film 10 is etched by an isotropic etching method such as a dry etching method with using hydrofluoric acid gas and methanol as catalyst. The support portion 10b remains on the substrate 9, and a part of the oxide film 10 is removed. The part of the oxide film 10 is disposed on both sides of the support portion 10b.

Thus, the oxide film 10 disposed under the movable electrode 3d and the fixed electrode 4b is removed, as shown in FIG. 9A. At the same time, the sidewall 10a of the oxide film 10 disposed under the anchor portion 3c is curved. The oxide film 10 disposed under the center portion of the anchor portion 3c remains on the substrate 9 so that the oxide film 10 provides the support portion 10b. Around the base portion 4a, the oxide film 10 is not removed, so that the base portion 4a is stably supported on the substrate 9. Thus, the fixed electrode 4bm the movable electrode 3d and the anchor portion 3c are formed at the same time.

Figure 2:
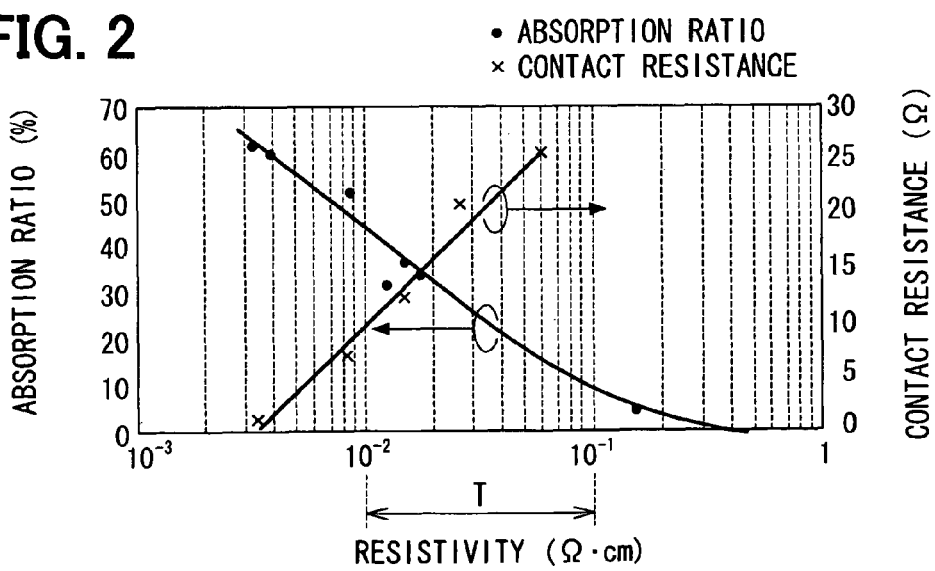
FIG. 2 is a graph showing a relation ship among infrared light absorption ratio, a contact resistance and resistivity.

FIG. 2 shows a relationship between absorption ratio of infrared light and resistivity of the P conductive type silicon layer 11. Further, FIG. 2 shows a relationship between a contact resistance between the silicon layer 11 and the electrode pad 6 in the anchor portion 3c. When the SOI substrate is diced, the infrared light is irradiated on the SOI substrate to check deviation of alignment. In view of this point, it is preferable to reduce the absorption ratio of the infrared light. Accordingly, to reduce the absorption ratio of the infrared light, the resistivity is increased, so that the impurity concentration in the silicon layer 11 is reduced. On the other hand, to reduce the contact resistance between the silicon layer 11 and the electrode pad 6, the resistivity of the silicon layer 11 is reduced, so that the impurity concentration in the silicon layer 11 is increased.

Thus, it is required to balance the above trade off relationship. To check the alignment easily in case of a dicing process, the absorption ratio is preferably equal to or smaller than 50%. Thus, the resistivity of the silicon layer 11 is set to be equal to or larger than $10^{-2}$ Ω·cm so that the absorption of the infrared light is equal to or smaller than 50%. To reduce the contact resistance to be a predetermined value, the resistivity is preferably equal to or smaller than $10^{-1}$ Ω·cm. Thus, the resistivity is set to be in a range T between $10^{-2}$ Ω·cm and $10^{-1}$ Ω·cm. Here, in FIG. 2, the contact resistance is from a few Ω to a few tens Ω. Thus, the contact resistance is much smaller than the resistance of the electrode pad 6 made of aluminum, the wiring resistance of the silicon layer 11 and the like so that the contact resistance is negligibly small.

Figure 3A:
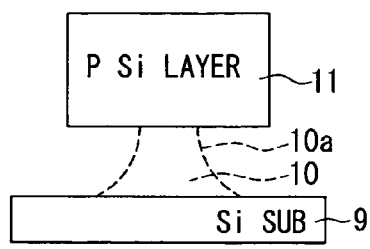
FIGS. 3A and 3B are diagrams showing insulation film structure with different conductive type substrates.
Figure 3B:
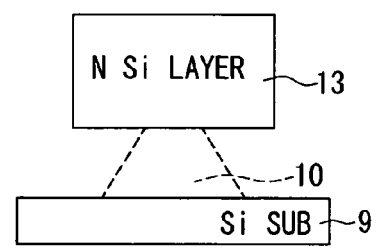
Figure 4A:
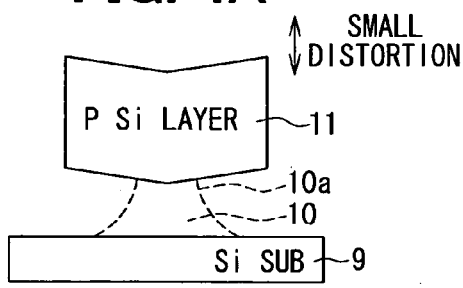
FIGS. 4A and 4B are diagram showing insulation film structure with different conductive type substrates.
Figure 4B:
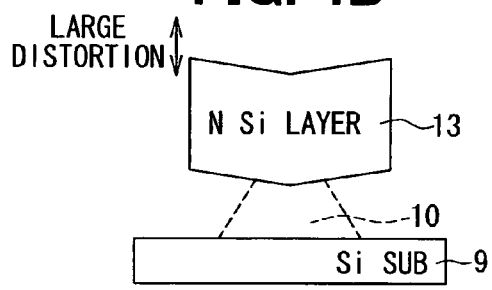

FIGS. 3A and 4A show distortion in the sensor 300, in which the P conductive type silicon layer 11 is used. FIGS. 3B and 4B show distortion in the sensor 300, in which the N conductive type silicon layer 13 is used.

When the silicon layer 13 with a N conductive type impurity such as phosphorus doped therein is bonded to the silicon substrate 9 via the oxide film 10, the oxide film 10 functions as a wedge so that an angle between the sidewall of the oxide film 10 and an interface of the silicon layer 13 and the oxide film 10 becomes sharp. Thus, as shown in FIG. 4B, the distortion of the silicon layer 13 becomes large. In this embodiment, since the silicon layer 11 is the P conductive type, the distortion is small, as shown in FIG. 4A.

Figure 5:
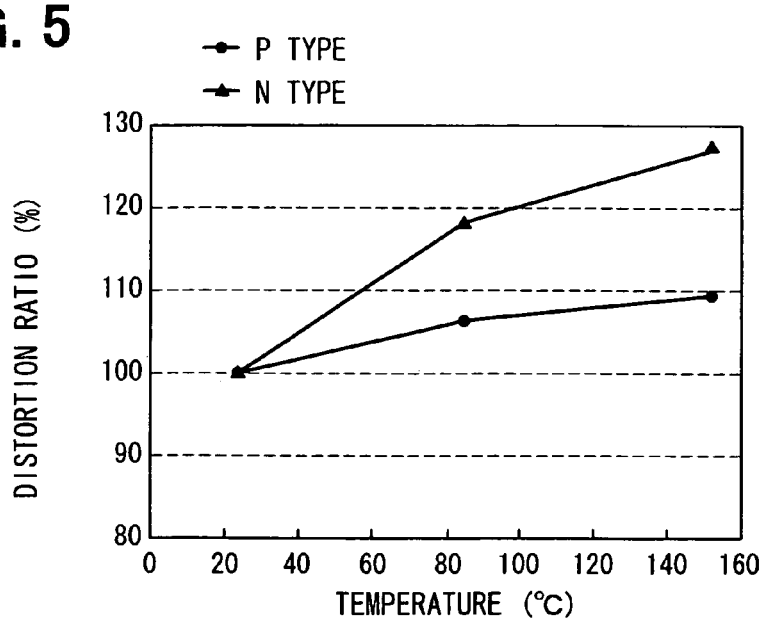
FIG. 5 is a graph showing a relationship between temperature and distortion ratio.

FIG. 5 shows a relationship between temperature and a distortion ratio in the sensor 300, in which the P conductive type silicon layer 11 or the N conductive type silicon layer 13 is used. When the temperature increases, the distortion ratio also increases. When the N conductive type silicon layer 13 is used, the variation of the distortion ratio with respect to the temperature is large. When the P conductive type silicon layer 11 is used, the variation of the distortion ratio with respect to the temperature is small. Since environment around the sensor 300 is harsh in a case where the sensor 300 is used for a vehicle, it is preferable to use the P conductive type silicon layer 11 in the sensor 300.

In this embodiment, the acceleration sensor 300 includes the movable electrode 3d and the fixed electrode 4b, which are separated from each other. The sensor 300 detects the acceleration as a physical quantity based on the capacitance change between the electrodes 3d, 4b. The silicon layer 11 is stacked on the support substrate 9 via the oxide film 10, in which the P conductive type impurity is doped. The silicon layer 11 is processed by the anisotropic etching method until the surface of the oxide film 10 is exposed so that the movable electrode 3d and the fixed electrode 4b as a first electrode portion is formed to have the first width W1, and a part of the movable electrode 3, i.e., the anchor portion 3c, is formed to have the second width W2. The second width W2 is wider than the first width W1. The exposed oxide film 10 is etched isotropically so that the support portion 1b under the anchor portion 3c is not removed, and the part of the oxide film 10 adjacent to the support portion 10b is removed. The etching rate around the interface between the silicon layer 11 and the oxide film 10 is reduced, so that the wedge is not formed at the connection surface between the silicon layer 11 and the oxide film 10. Thus, the stress concentration is reduced, so that mechanical reliability of the sensor 300 is improved.

When the electrode pad 6 made of aluminum is formed on the surface of the silicon layer 11, the electrode pad 6 is formed by the wet etching method. Thus, the characteristics of the silicon layer 11 are not deteriorated.

Since the impurity is highly doped in the silicon layer 11, the connection between the P conductive type silicon layer 11 and the aluminum electrode pad 6 provides ohmic contact. Thus, it is not necessary to introduce an impurity in the silicon layer 11 again by an implantation method.

The oxide film 10 under the anchor portion 3c has a width along with the X-axis, and the width becomes narrower as it goes from the support substrate 9 to the silicon layer 11. The P conductive type impurity is doped in the oxide film 10, and the sidewall 10a of the oxide film 10 is curved in a concaved manner. Since the silicon layer 11, in which the P conductive type impurity is doped, is formed on the oxide film 10, the stress concentration is reduced, and the mechanical reliability of the sensor 300 is improved. Further, the temperature dependence of the distortion ratio is reduced.

Since the resistivity of the silicon layer 11 is set in a range between 0.01 Ω·cm and 0.1 Ω·cm, the contact resistance is sufficiently small, and the absorption ratio of the infrared light is sufficiently low. Thus, the transmission factor of the infrared light is sufficient so that it is easy to perform alignment in case of the dicing process with using the infrared light. Thus, misalignment is reduced.

Second Embodiment

FIGS. 10 to 15 show a physical quantity sensor according to a second embodiment. In the sensor, a cap substrate and a sensor substrate are formed in the sensor. Further, a through-hole electrode is formed in the cap substrate so that the cap substrate is electrically coupled with a semiconductor layer in the sensor substrate.

The silicon layer for providing a sensor structure is covered with the cap substrate so that the sensor structure is accommodated in a cavity between the cap substrate and the silicon layer.

Figure 11A:
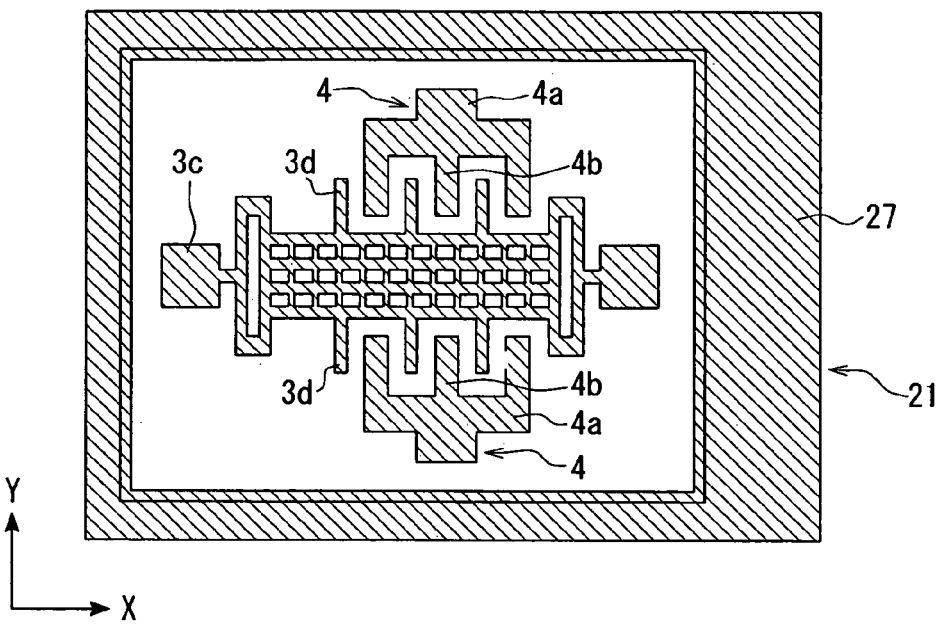
FIG. 11A is a cross sectional view showing the sensor taken along line XIX-XIA in FIG. 10.
Figure 11B:
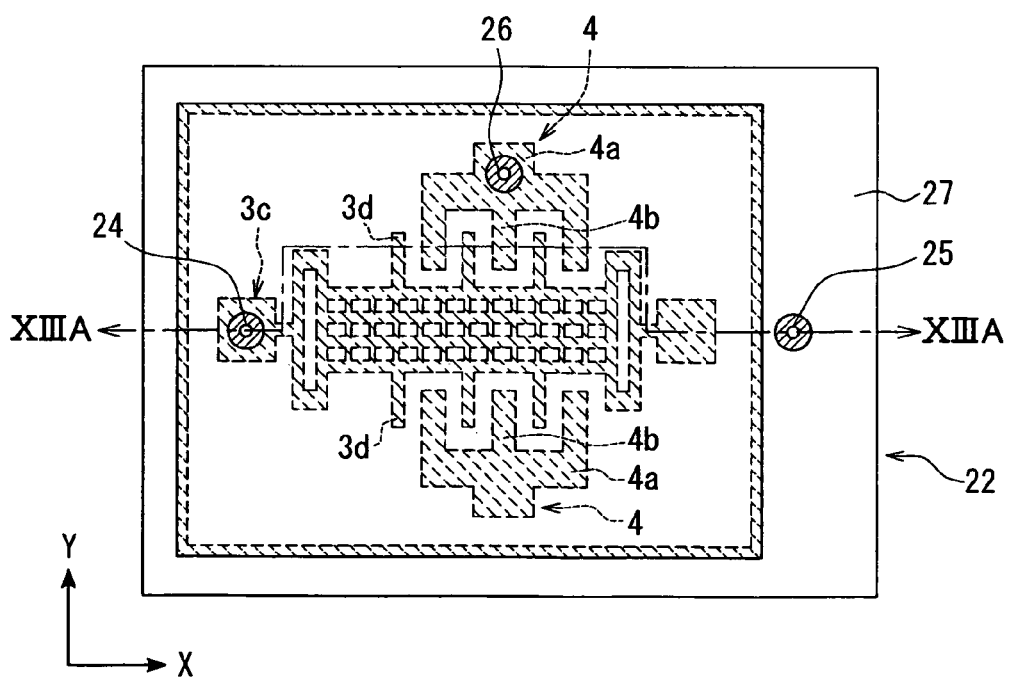
FIG. 11B is a cross sectional view showing the sensor taken along line XIB-XIB in FIG. 10.
Figure 12:
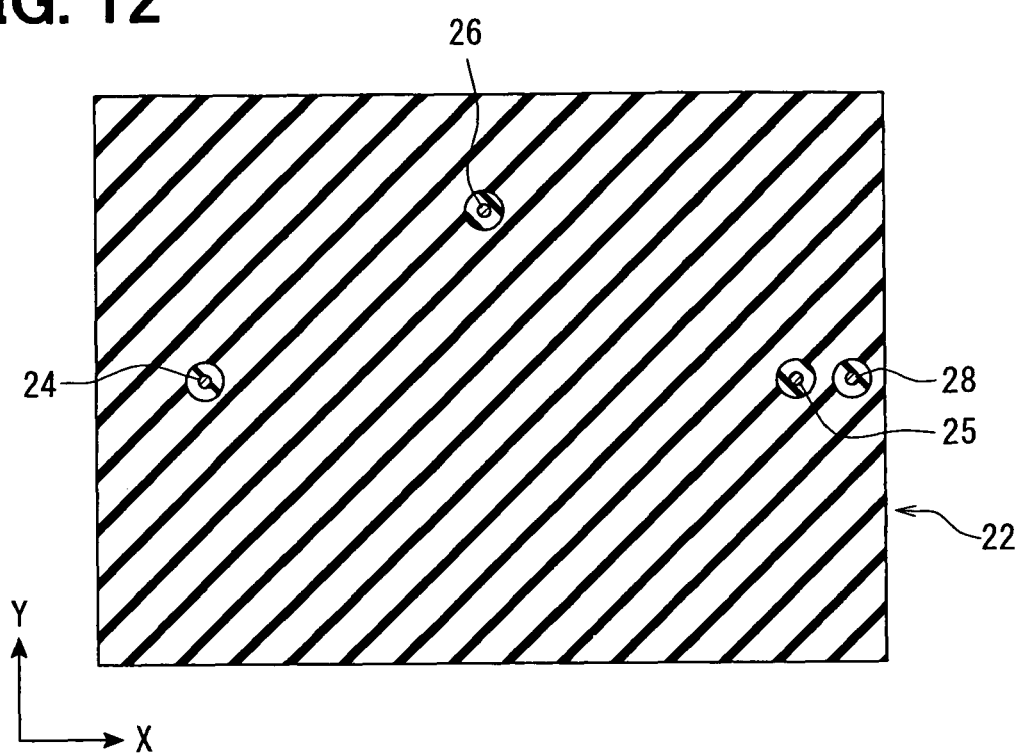
FIG. 12 is a cross sectional view showing the sensor taken along line XII-XII in FIG. 10.

FIG. 10 shows the cap substrate 22' and the sensor substrate 21. FIG. 11A shows a planar cross section of the sensor substrate 21 along with line XIA-XIA in FIG. 10, and FIG. 11B shows a planar cross section of the cap substrate 22. FIG. 12 shows a planar cross section of the cap substrate 22 along with line XII-XII in FIG. 10. Here, FIG. 10 shows a cross section of the sensor along with XIIIA-XIIIA in FIG. 11B. As shown in FIG. 11A, the planar cross section of the sensor substrate 21 is almost similar to that in FIG. 1.

As shown in FIG. 10, the cap substrate 22 contacts the sensor substrate 21. The cap substrate 22 includes a second support substrate 22a made of P conductive type silicon. A concavity 22aa is formed on a backside (i.e., a lower side) of the second support substrate 22a. An insulation film 22b is formed such that the insulation film 22b covers the concavity 22aa and an outer periphery of the substrate 22a. The concavity 22aa provides the cavity for accommodating the movable electrode 3d, the fixed electrode 4b and the like so that the movable electrode 3d is movable in the cavity.

Multiple electrodes 24-26 as a through hole electrode are formed in the cap substrate 22 such that each electrode 24-26 penetrates the cap substrate 22. Each electrode 24-26 connects to the surface of the silicon layer 11. Each electrode 24-26 is formed in a through hole of the substrate 22a via insulation films 22b, 23 so that the electrode 24-26 does not directly contact the substrate 22a.

The electrode 24 is structurally and electrically connected to the anchor portion 3c. The electrode 25 structurally contacts a periphery portion 27 in the silicon layer 11. As shown in FIG. 11A, the periphery portion 27 is disposed around the movable electrode 3d and the fixed electrode 4b such that the periphery portion 27 is separated from the movable electrode 3d and the fixed electrode 4b. Further, the periphery portion 27 surrounds the movable electrode 3d and the fixed electrode 4b so that the electric potential of the periphery portion 27 is fixed to a predetermined potential such as ground potential. As shown in FIG. 10, the electrode 28 penetrates the insulation film 22b in the cap substrate 22 so that the electrode 28 is structurally connected to the substrate 22a.

As shown in FIGS. 11B and 12, the electrode 26 is connected to the base portion 4a of the fixed unit 4. A vertical cross section of the electrode 26 is not shown. The electrodes 24-26, 28 are made of metal such as aluminum and copper or heavily doped silicon having the P conductive type.

For example, when the electrode 24-26, 28 is made of aluminum or copper, a connection between the metal electrode 24-26, 28 and the P conductive type silicon layer 11 having the impurity heavily doped therein provides ohmic contact. Thus, it is not necessary to form a diffusion layer in the silicon layer 11. The sensor provides almost the same effects as the sensor according to the first embodiment.

A manufacturing method of the sensor will be explained as follows.

Figure 13A:
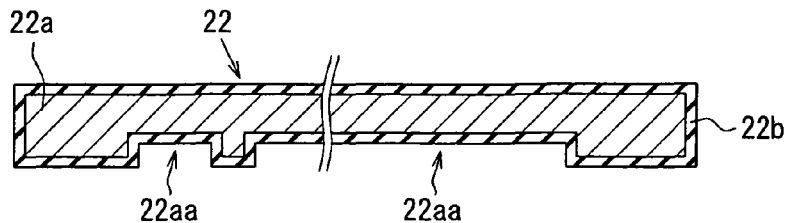
FIGS. 13A to 13D are cross sectional views showing a manufacturing method of the sensor taken along line XIIIA-XIIIA in FIG. 11B.

As shown in FIG. 13A, a resist (not shown) is formed on a silicon substrate having a plate shape, and patterned by a photo lithography method. Then, the silicon substrate is etched so that the concavity 22aa is formed, and after that, the whole surface of the support substrate 22a is oxidized so that the insulation film 22b is formed.

Figure 13B:
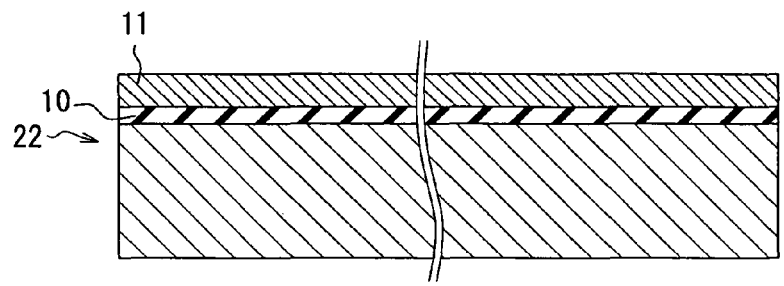

As shown in FIG. 13B, the sensor substrate 21 is made of the SOI substrate as a base substrate including the support substrate 9, the oxide film 10 and the single crystal silicon layer 11, which are bonded together in this order. The substrate 9 is made of single crystal silicon having the P conductive type. The silicon layer 11 has the P conductive type. Alternatively, the sensor substrate 21 may be formed such that the oxide film 10 is formed on the substrate 9, and the silicon layer 11 is formed by depositing a poly silicon film on the oxide film 10 by a CVD method. The poly silicon film has the P conductive type impurity with high concentration. Thus, the silicon layer 11 is formed.

Figure 13C:
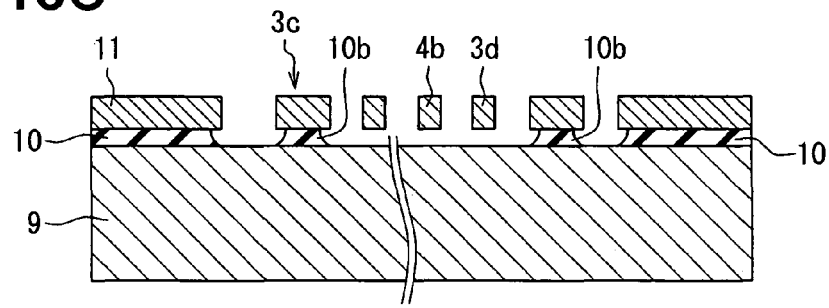

As shown in FIG. 13C, another resist (not shown) is formed on the silicon layer 11, and patterned by a photo lithography method. The support portion 10b of the oxide film 10 under the anchor portion 3c remains, i.e., is not removed, and the oxide film 10 under the movable electrode 3d and the fixed electrode 4b is removed.

Figure 13D:
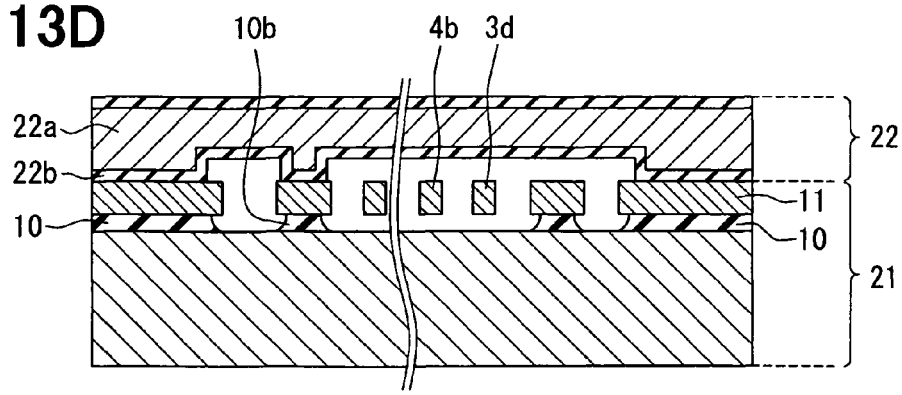

After a cleaning process, as shown in FIG. 13D, the sensor substrate 21 is bonded to the cap substrate 22 by a fusion method, a plasma activation method, a normal temperature bonding method or the like.

Figure 14A:
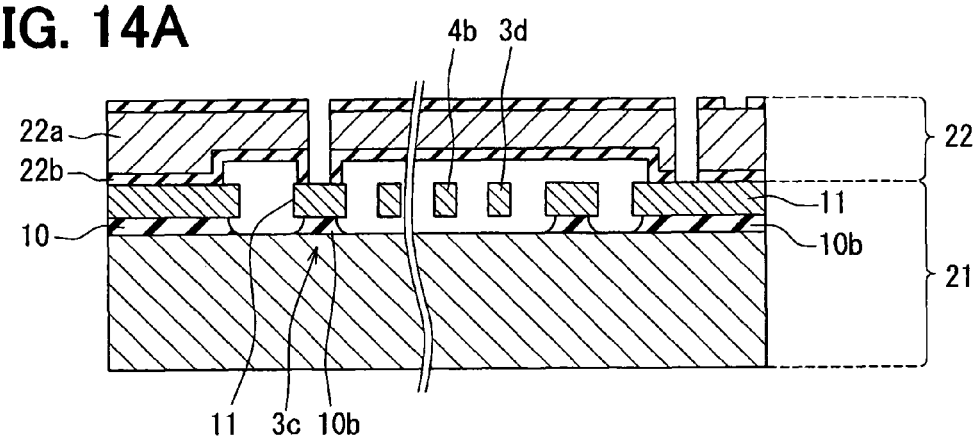
FIGS. 14A to 14B are cross sectional views showing the manufacturing method of the sensor taken along line XIIIA-XIIIA in FIG. 11B.

As shown in FIG. 14A, a resist (not shown) is formed on the cap substrate 22 and patterned by the photo lithography method. The through hole is formed in the cap substrate 22 to reach the anchor portion 3c and the periphery portion 27. At the same time or in a different process, a through hole (not shown) is formed to reach the base portion 4a of the fixed unit 4.

Figure 14B:
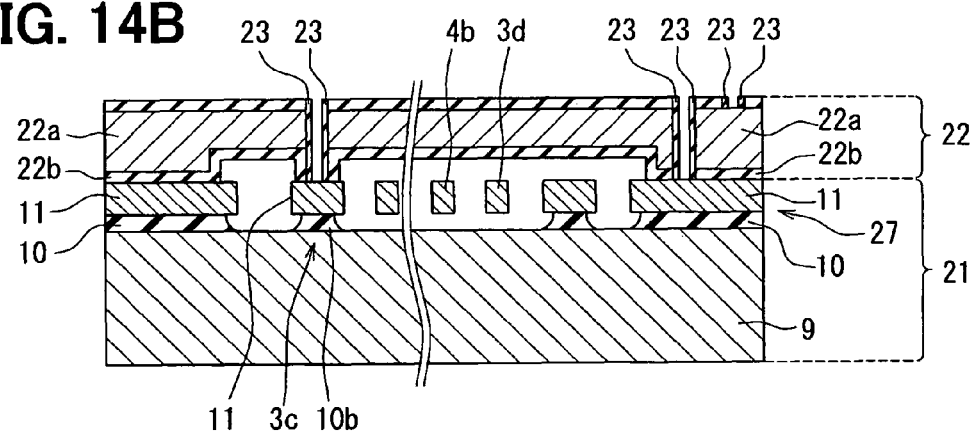

As shown in FIG. 14F, an oxide film 23 is formed in the hole of the cap substrate 22 by a thermal oxidation method, a CVD method, a sputtering method or the like. Next, a resist (not shown) is formed on the surface of the oxide film 23 and patterned by the photo lithography method. The oxide films 22b, 23 are etched so that the through hole is formed to reach the surface of the silicon layer 11. In FIG. 14B, the oxide film 23 is formed on the inner surface of the hole by the thermal oxidation method. Then, the oxide film 23 on the silicon layer 11 is removed.

Next, as shown in FIGS. 10, 11A and 11B, multiple electrodes 24-26, 28 are formed on the silicon layer 11. Thus, a contact for connecting to the anchor portion 3c and a contact for retrieving the electric potential of the substrate 22a are formed.

Figure 15:
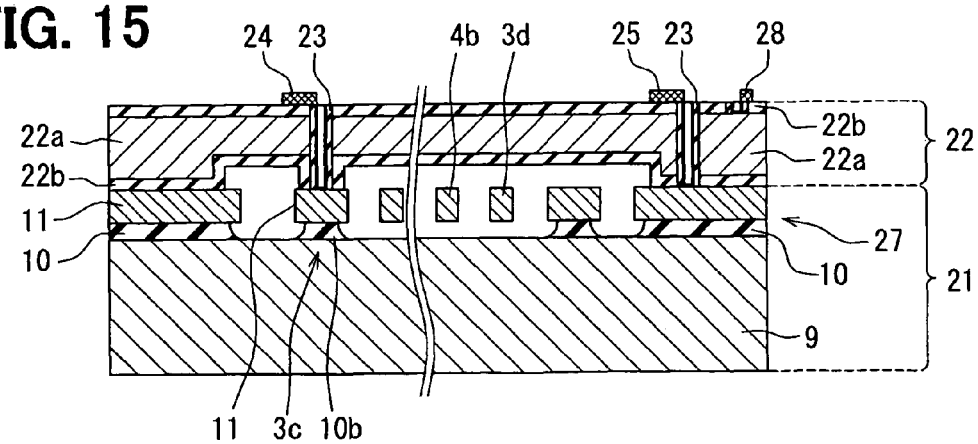
FIG. 15 is a cross sectional view showing a physical quantity sensor having a different electrode according to a modification of the second embodiment.

Then, as shown in FIG. 15, a center portion of each electrode 24-26, 28 may be etched and removed. In this case, a failure for reducing reliability of the sensor 300 is prevented, and the failure is caused by influence of thermal expansion of the electrode 24-26, 28, which is occurred at the heat treatment. Here, the method of manufacturing the sensor 300 may include the removal step of the electrode 24-26, 28 if necessary.

The silicon layer 11 having the P conductive type impurity doped therein is formed on the P conductive type support substrate 9 via the oxide film 10b, in which the P conductive type impurity is doped. Since the electrode 24 formed on the cap substrate 22 is made of P conductive type impurity doped silicon, it is not necessary to form a diffusion layer. Thus, the resistivity range can be improved so that the characteristics of the sensor 300 are improved. Further, since the method, of manufacturing the sensor 300 does not include the step of forming the diffusion layer, the manufacturing process of the sensor 300 is simplified.

Further, the cap substrate 22 and the sensor substrate 21 are independently formed. Then, the electrodes 24-26 are formed in the cap substrate 22 to penetrate the cap substrate 22 so that the electrodes 24-26 connects the silicon layer 11 in the sensor substrate 21 and the cap substrate 22. Thus, the sensor 300 according to the second embodiment provides almost the same effect as the sensor 300 according to the first embodiment.

Third Embodiment

FIGS. 16A to 17E shows a sensor according to a third embodiment. The through hole electrode 22c is mainly made of material of a second support substrate 22a of the cap substrate 32. Further, a groove 22f provides air isolation between the base substrate 22a and the through hole electrode 22c so that the second support substrate 22a is insulated from the though hole electrode 22c.

Figure 16A:
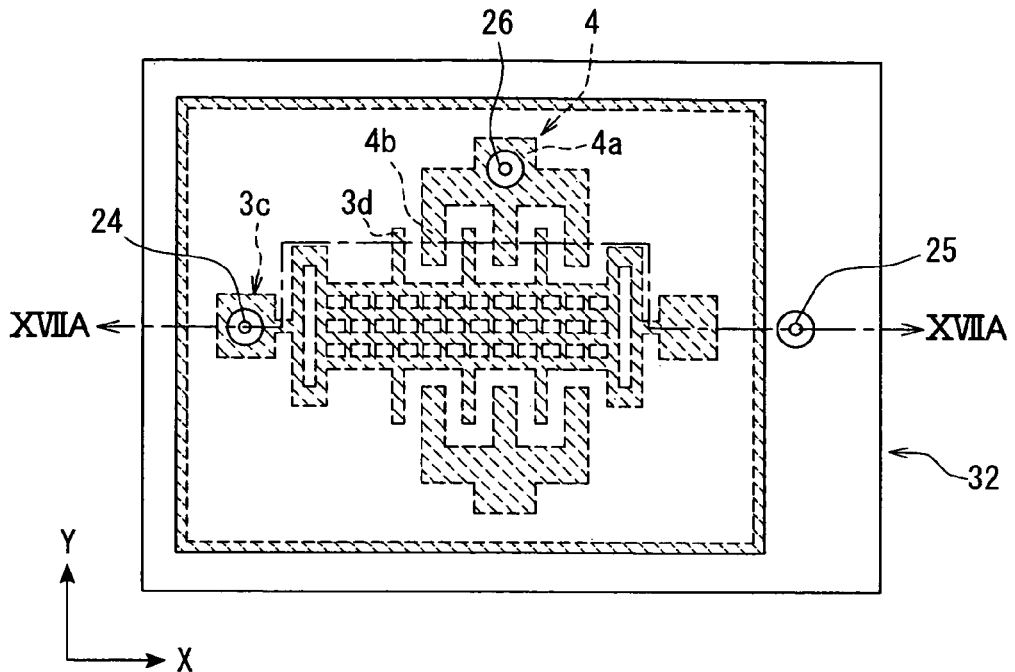
FIGS. 16A and 16B are cross sectional views showing a physical quantity sensor according to a third embodiment.
Figure 16B:
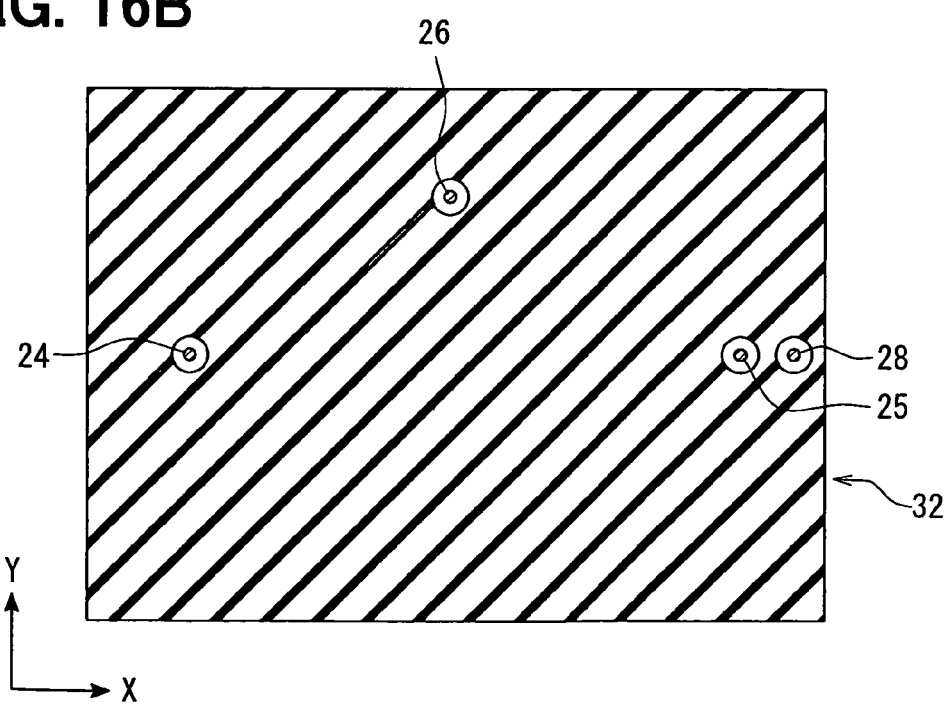

FIG. 16A corresponds to FIG. 11A, and FIG. 16B corresponds to FIG. 11B. FIG. 17E is a cross sectional view showing the sensor taken along line XVIIA-XVIIA in FIG. 16A.

The sensor includes a cap substrate 32, which is different from the cap substrate 22 in FIG. 10. The cap substrate 32 includes the second support substrate 22a, an insulation film 22b and a silicon layer 22c. The silicon layer 22c as a through hole electrode is formed to process the second support substrate 22a. The silicon layer 22c functions as a through hole electrode for electrically connecting the anchor portion 3c via an electrolytic plating portion 22d. The silicon layer 22c and the electrolytic plating portion 22d are separated from the second support substrate 22a by a clearance therebetween. Thus, the clearance provides air isolation between the silicon layer 22c or the electrolytic plating portion 22d and the second support substrate 22a.

The manufacturing method of the sensor will be explained as follows.

Figure 17A:
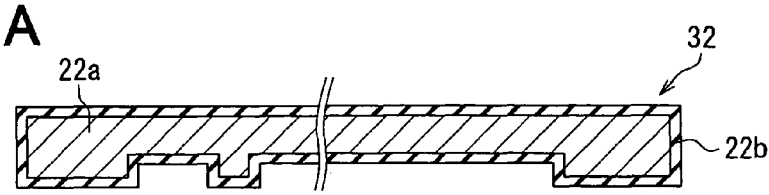
FIGS. 17A to 17E are cross sectional views showing a manufacturing method of the sensor taken along line XVIIA-XVIIA in FIG. 16A.
Figure 17B:
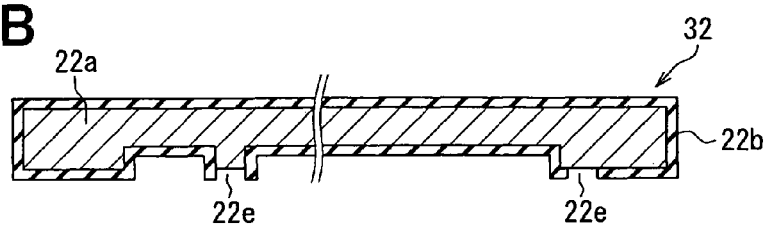
Figure 17C:
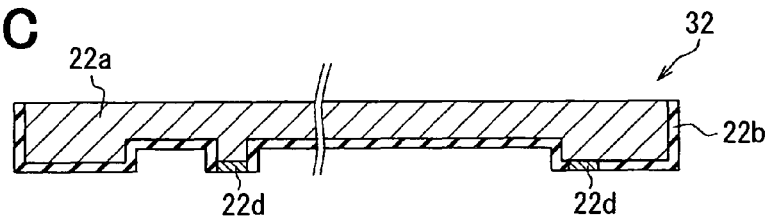

As shown in FIG. 17A, the insulation film 22b is formed on a whole exposed surface of the support substrate 22a. As shown in FIG. 17B, a resist (not shown) is formed and patterned on a region to be a contact portion by a photo lithography process. A part of the insulation film 22b on the backside of the substrate 22a is etched and removed so that an opening 22e is formed. As shown in FIG. 17C, the oxide film 22b on the surface of the substrate 22a is removed by a dry etching method such as a RIE method, a CMP method or a wet etching method with using hydrofluoric acid. Then, the electrolytic plating portion 22d is formed on the bottom of the silicon substrate 2 exposed in the opening 22e by an electrolytic plating method. Thus, the electrolytic plating portion 22d is electrically connected to the second support substrate 22a.

Figure 17D:
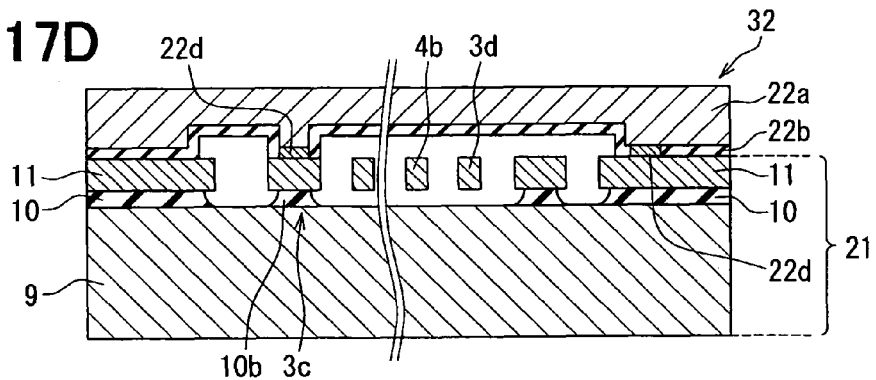
Figure 17E:
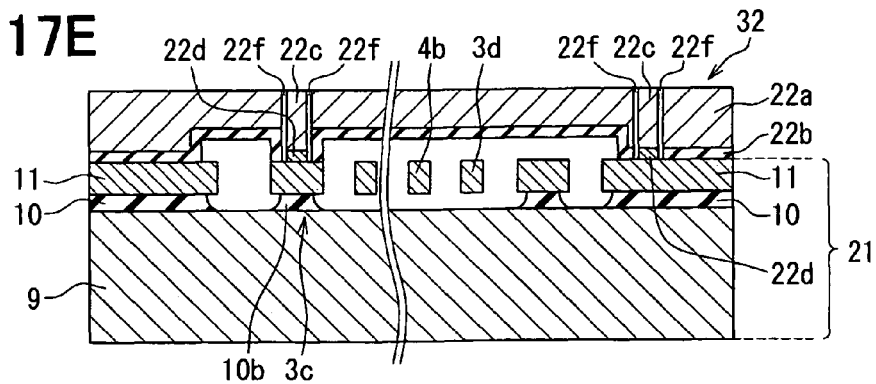

As shown in FIG. 17D, the electrolytic plating portion 22d is bonded to the surface of the silicon layer 11 of the anchor portion 3c in the sensor substrate 21. Further, the electrolytic plating portion 22d is bonded to the surface of the silicon layer 11 of the periphery portion 27. Thus, the cap substrate 32 and the sensor substrate 21 are connected to each other.

As shown in FIG. 17E, a trench (i.e., a through hole) 22f is formed in the support substrate 22a by the anisotropic etching method such as the RIE method so that the trench 22f reaches the surface of the silicon layer of the anchor portion 3c and the surface of the periphery portion 27. Thus, the silicon layer 22c is separated from other portions of the support substrate 22a, so that the air isolation structure is formed. Alternatively, after the trench 22f is formed to reach the surface of the insulation film 22b, the insulation film 22b may be removed in another step.

In this embodiment, the second support substrate 22a is etched so that the silicon layer 22c is electrically separated from other portions of the second support substrate 22a. Thus, the air isolation structure is provided, so that a parasitic capacitance is reduced. Further, the sensor according to the third embodiment has substantially the same advantage as the sensor according to the second embodiment.

(Modifications)

FIGS. 18A to 19B show sensors according to modifications of the third embodiment. In FIGS. 18A to 19B, a through hole is formed to reach the insulation film 22b arranged on a concavity 22aa of the support substrate 22a.

Figure 18A:
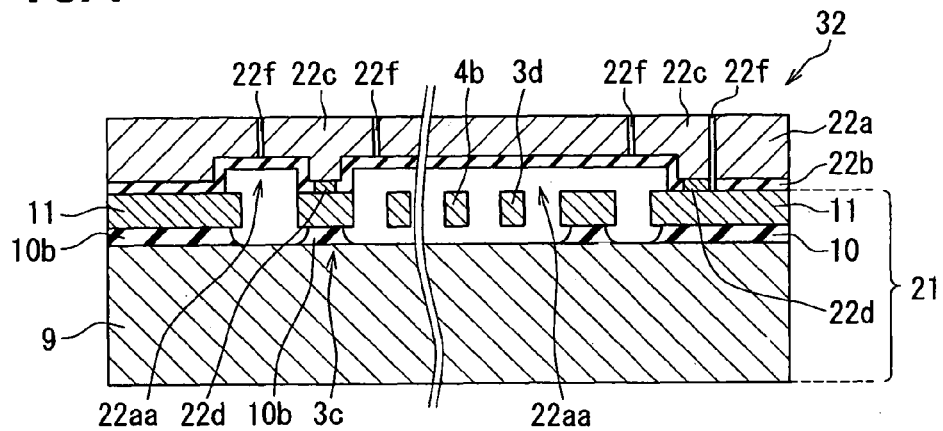
FIG. 18A is a cross sectional view showing a physical quantity sensor according to a first modification of the third embodiment.
Figure 18B:
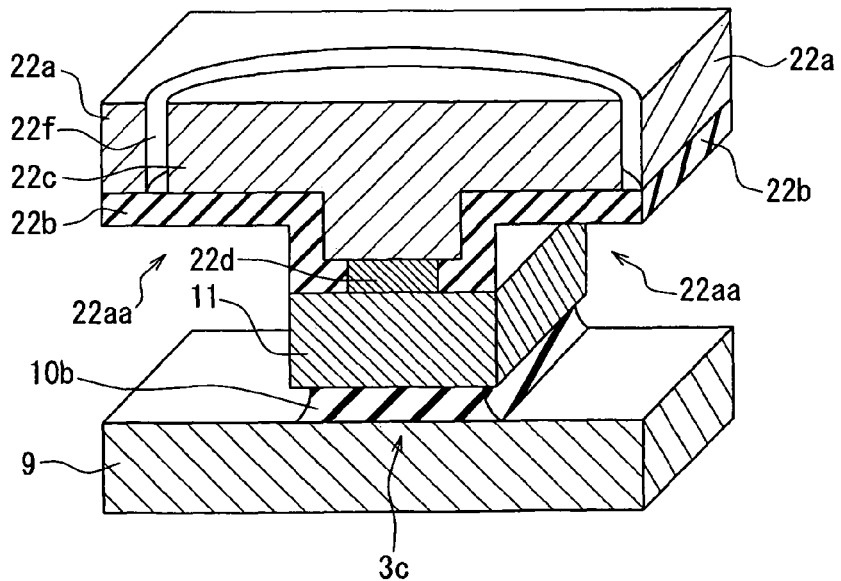
FIG. 18B is a perspective view showing the sensor in FIG. 18A.

As shown in FIG. 18A, the insulation film 22b is formed on the concavity 22aa of the support substrate 22a. The trench 22f reaches the insulation film 22b on the concavity 22aa. Thus, the air isolation structure is formed. A contact area on the support substrate 22a becomes large, so that it is easy to form a bonding wire on an exposed surface of the silicon layer 22c or to connect the silicon layer 22c with a bump.

In the above case, the trench 22f is formed by the anisotropic etching method such as the RIE method. By selecting an etching condition to differentiate an etching rate between the insulation film 22b and the support substrate 22a, i.e., by controlling a selection rate between the insulation film 22b and the support substrate 22a, the etching step of the support substrate 22a can be controlled to stop etching at the surface of the insulation film 22b without exactly adjusting an etching time. Accordingly, the trench 22f does not penetrate the insulation film 22b so that the trench 22f reach the cavity. Airtightness of the cavity between the cap substrate 22 and the sensor substrate 21 is secured since the trench 22f is formed to a region of the support substrate 22a, in which the concavity 22aa is formed. An etching time becomes short.

The silicon layer 22c and the electrolytic plating portion 22d provide the contact portion. The contact portion is isolated from other portions of the support substrate 22a by the air isolation structure, and electrically contacts the surface of the silicon layer 11.

Figure 19A:
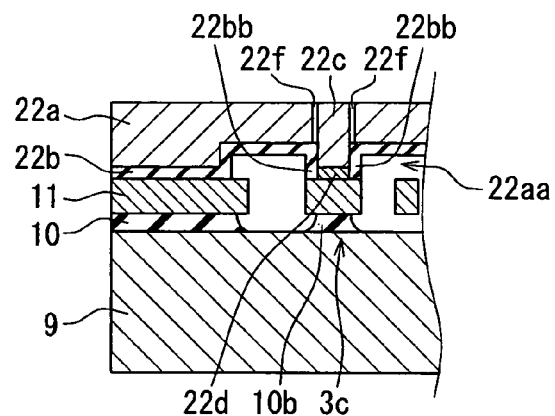
FIG. 19A is a partial cross sectional view showing a physical quantity sensor according to a second modification of the third embodiment.
Figure 19B:
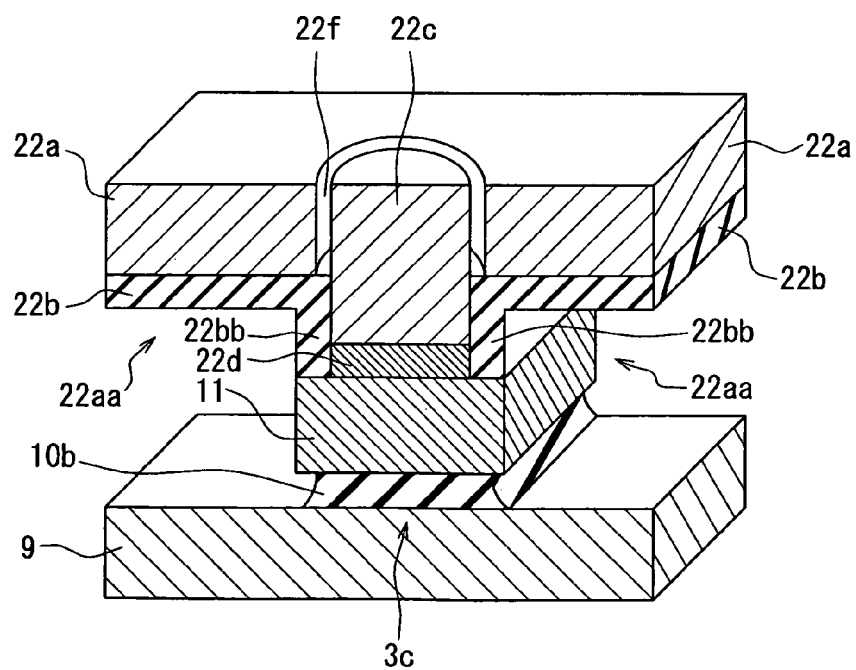
FIG. 19B is a perspective view showing the sensor in FIG. 19A.

As shown in FIGS. 19A and 19B show another sensor according to another modification of the third embodiment. The insulation film 22b is formed on the concavity 22aa of the support substrate 22a. The insulation film 22b as a part 22bb is formed on a sidewall of the concavity 22aa, which extends in a vertical direction. The part 22bb of the insulation film 22b is shown in FIGS. 19A and 19B.

The trench 22f reaches the part 22bb of the insulation film 22b such that the sidewall of the trench 22f is disposed on the same plane of the part 22bb. When the trench 22f is formed by the anisotropic etching method, the support substrate 22a is etched with a condition to differentiate an etching rate between the insulation film 22b and the support substrate 22a, i.e., to control a selection rate between the insulation film 22b and the support substrate 22a. Since the part 22bb of the insulation film 22b extends in the vertical direction, the etching step of the support substrate 22a can be controlled to stop etching at the surface of the insulation film 22b even if the support substrate 22a is over-etched. Thus, the trench 22f does not penetrate the insulation film 22b so that the trench 22f reach the cavity. Air-tightness of the cavity between the cap substrate 22 and the sensor substrate 21 is secured.

Fourth Embodiment

FIGS. 20A to 20D show a method for manufacturing a sensor according to a fourth embodiment. An air isolation structure is formed after a silicon layer 22g is formed in a trench 22f.

Figure 20A:
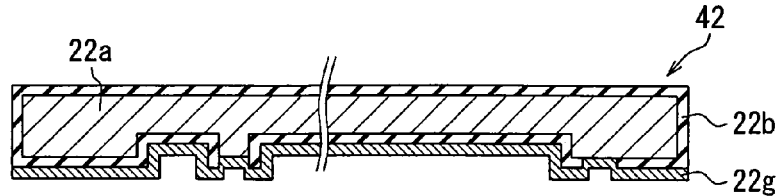
FIGS. 20A to 20D are cross sectional views showing a manufacturing method of a physical quantity sensor according to a fourth embodiment.
Figure 20B:
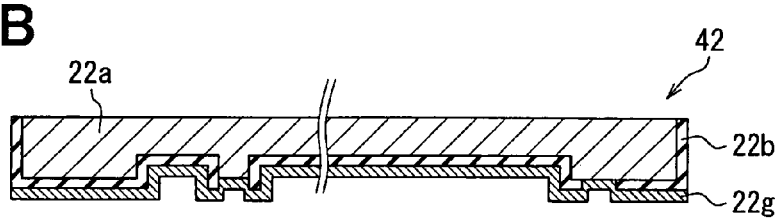
Figure 20C:
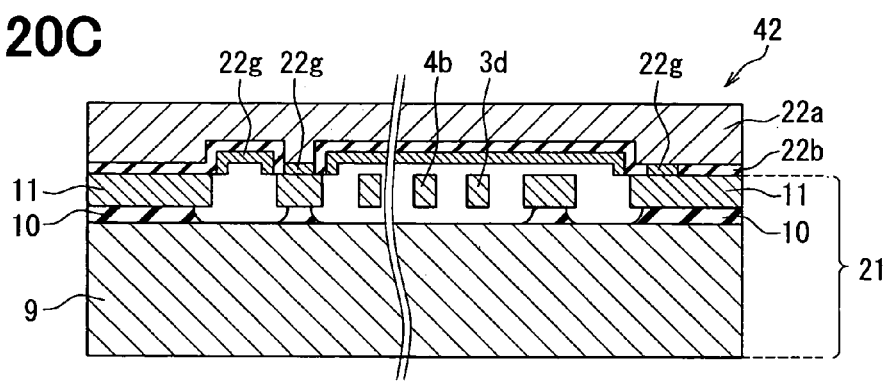
Figure 20D:
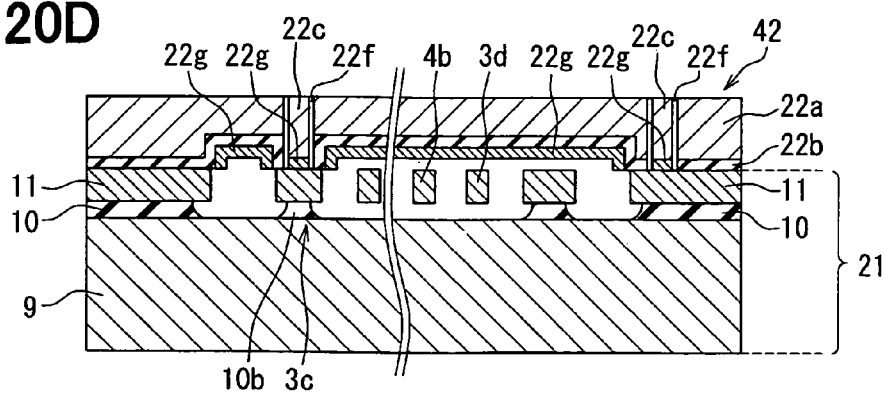

FIG. 20D is a cross sectional view showing the sensor, which corresponds to the sensor taken along line XVIIA-XVIIA in FIG. 16A.

The cap substrate 42 includes the second support substrate 22a, the insulation film 22b, the silicon layer 22c and a P conductive type silicon layer 22g. The silicon layer 22g corresponds to the electrolytic plating portion 22d in FIG. 17E. Thus, the silicon layer 22g is disposed between the silicon layer 22c and the anchor portion 3c.

A method for manufacturing the sensor will be explained as follows. After a structure shown in FIG. 17b is formed, the silicon layer 22g is formed on a backside of the cap substrate 42 including the surface of the concavity 22e. The concavity 22aa is formed on the support substrate 22a. The silicon layer 22g is also formed on the concavity 22aa. As shown in FIG. 20C, the silicon layer 22g is spaced apart from the silicon layer 11 in the sensor substrate 21 so that the silicon layer 22g does not contact the silicon layer 11. A method for manufacturing the silicon layer 22g may be an epitaxial growth method or a deposition method for depositing a poly silicon layer with a P conductive type impurity doped therein by a CVD method.

As shown in FIG. 20B, the insulation film 22b on the foreside of the cap substrate 42 is removed. The removal of the insulation film 22b may be a wet etching method such that the foreside surface of the support substrate 22a is processed with using etchant such as hydrofluoric acid and a resist for covering the bottom of the support substrate 22a. Alternatively, the removal of the insulation film 22b may be a dry etching method such as the RIE method and a flattening method of the CMP method. Then, the backside of the cap substrate 42 is flattened by the CMP method with using the insulation film 22b as a stopper.

As shown in FIG. 20C, the cap substrate 42, and the sensor substrate 21 are bonded to each other. The silicon layer 22g in the trench 22f contacts the silicon layer 11 without forming a diffusion layer. Thus, the sensor according to the fourth embodiment has an electric connection structure similar to that in the third embodiment, so that the sensor has substantially the same advantage as the sensor according to the third embodiment.

(Modifications)

A double-layered structure having the insulation film 22b and the silicon layer 22b made of material different from the insulation film 22b is formed on the backside of the support substrate 22a before the through hole is formed in the cap substrate 42.

Figure 21A:
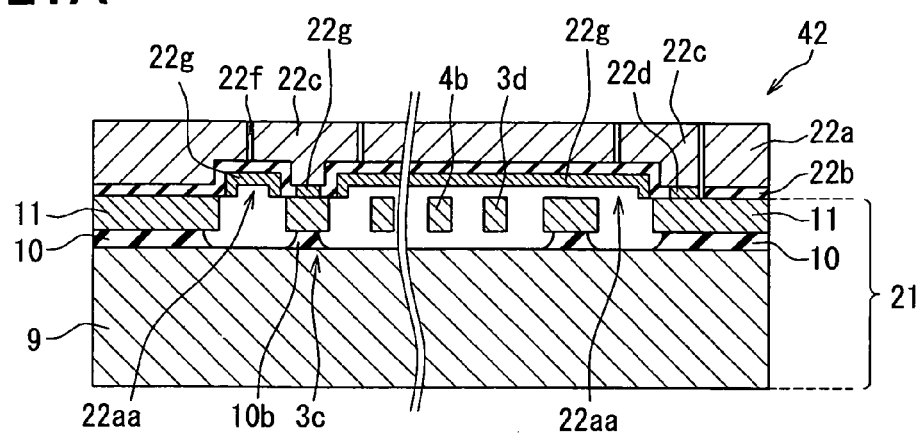
FIG. 21A is a cross sectional view showing a physical quantity sensor according to a modification of the fourth embodiment.
Figure 21B:
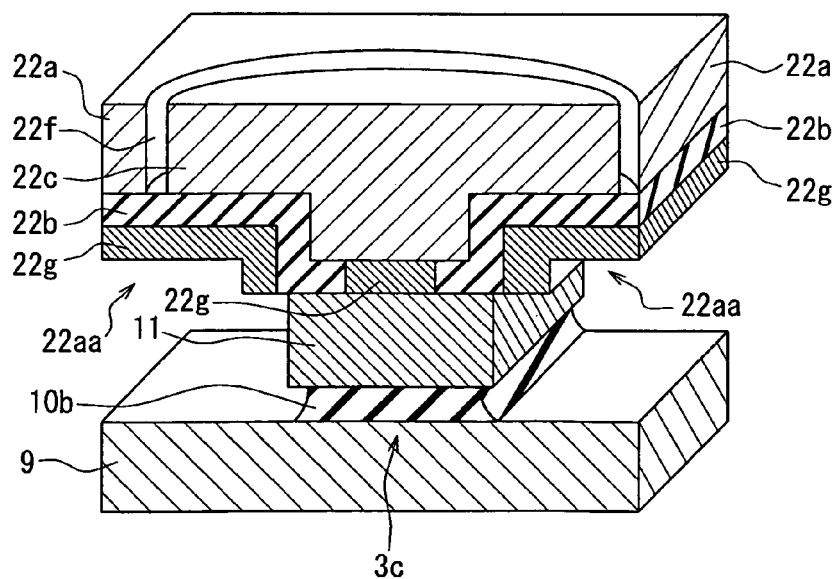
FIG. 21B is a perspective view showing the sensor in FIG. 21A.

As shown in FIG. 21A, the trench (i.e., the through hole) 22f is formed to reach the insulation film 22b on the concavity 22aa. The insulation film 22b is formed on the concavity 22aa of the support substrate 22a, in which the trench 22f is disposed. The silicon layer 22g covers the bottom of the insulation film 22b. The material of the silicon layer 22g is different from that of the insulation film 22b. The silicon layer 22g functions as a stopper so that the air-tightness of the cavity is improved.

When the trench 22f is formed, the support substrate 22a is etched by the anisotropic etching method such as the RIE method so that the etching step is terminated at the surface of the insulation film 22b. Even if the insulation film 22b is etched, the silicon layer 22g over the insulation film 22b provides to stop etching. In this case, the etching condition is set such that the selection rate between the silicon layer 22g and the insulation film 22b is clearly obtained. The etching process is terminated at the interface between the silicon layer 22g and the insulation film 22b. Thus, the cavity between the cap substrate 42 and the sensor substrate 21 provides the air-tightness and reliability of air-tightness. Thus, the bonding between the cap substrate 42 and the sensor substrate 21 is improved.

Fifth Embodiment

FIGS. 22A to 22D show a method of manufacturing a sensor according to a fifth embodiment. After the electrolytic plating portion 22d is formed as the contact portion by the electrolytic plating method, a metal film is formed on the through hole electrode. Then, the air isolation structure is formed.

Figure 22A:
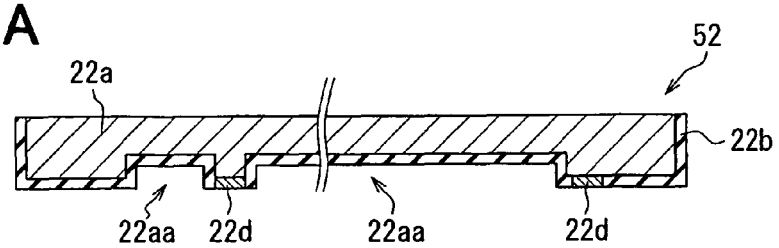
FIGS. 22A to 22D are cross sectional views showing a manufacturing method of a physical quantity sensor according to a fifth embodiment.
Figure 22B:
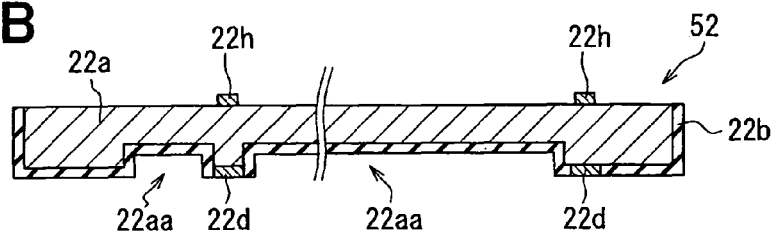
Figure 22C:
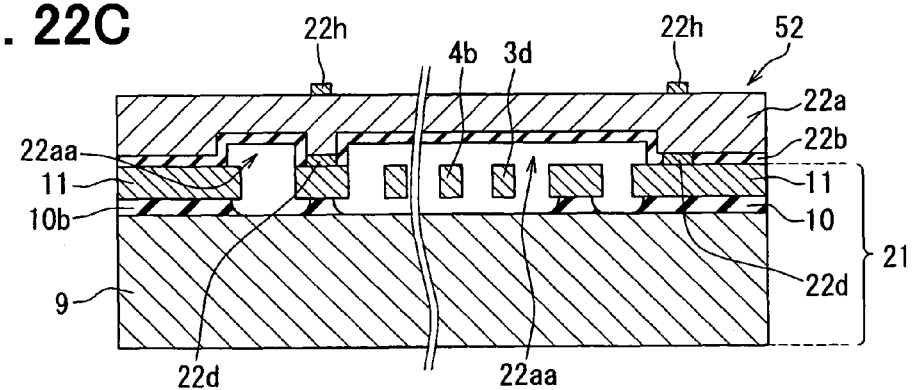
Figure 22D:
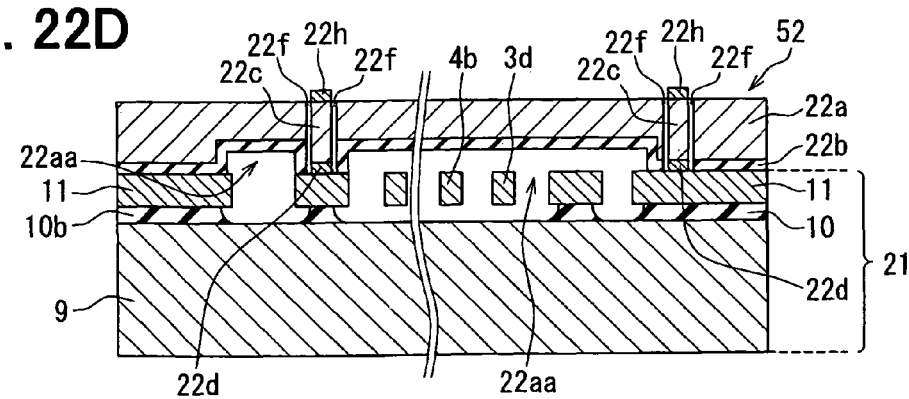

As shown in FIG. 22D, the cap substrate 52 includes the second support substrate 22a, the insulation film 22b, the silicon layer 22c, the electrolytic plating portion 22d and a metal electrode 22h made of aluminum and disposed on the silicon layer 22c.

The cap substrate 52 is formed in a process similar to the process shown in FIG. 17C. As shown in FIG. 22A, the electrolytic plating portion 22d is formed on the backside of the second support substrate 22a, which is exposed from the insulation film 22b. As shown in FIG. 22B, the metal electrode 22h is formed on the support substrate such that the metal electrode 22h is opposite to the electrolytic plating portion 22d. The metal electrode 22h protrudes from the support substrate 22a. As shown in FIG. 22C, the sensor substrate 21 and the cap substrate 52 are bonded to each other. As shown in FIG. 22D, the trench 22f is formed.

After the electrolytic plating portion 22d is formed as a part of the contact portion, the metal electrode 22h is formed on a part of the silicon layer to be the through hole electrode. Then, the trench 22f is formed so that the air isolation structure is formed. Thus, the electric connection structure of the sensor according to the fifth embodiment is similar to that of the fourth embodiment, so that the effect of the fifth embodiment is similar to that of the fourth embodiment. Since the metal electrode 22h protrudes from the support substrate 22a, a flip chip mounting structure is easily performed.

Sixth Embodiment

FIGS. 23A to 25B show a sensor according to a sixth embodiment. The sensor substrate 21 includes a pair of fixed electrodes, which are separately disposed on both sides of the movable electrode.

Figure 23A:
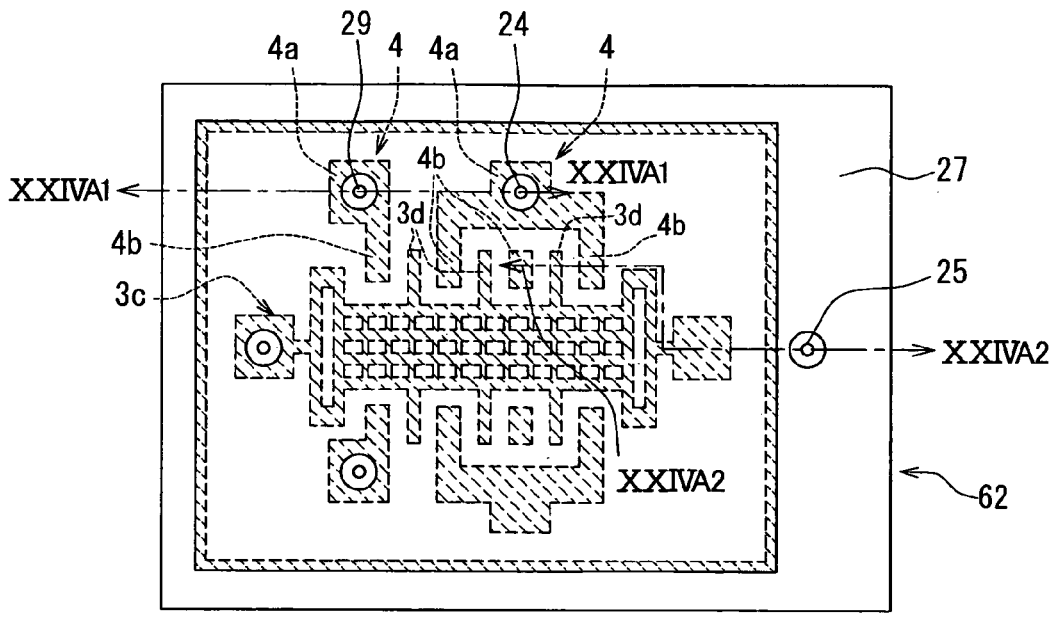
FIGS. 23A and 23B are cross sectional views showing a physical quantity sensor according to a sixth embodiment.
Figure 23B:
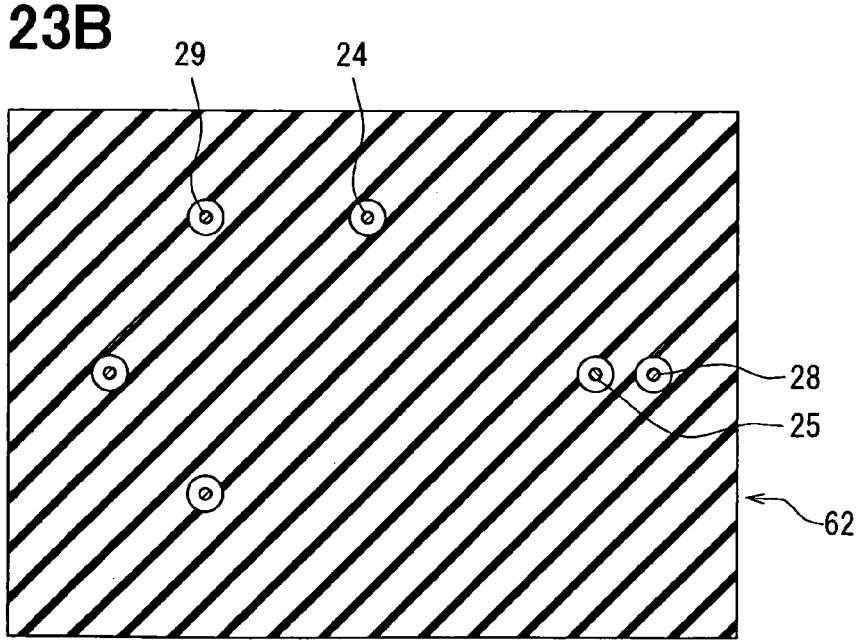
Figure 25A:
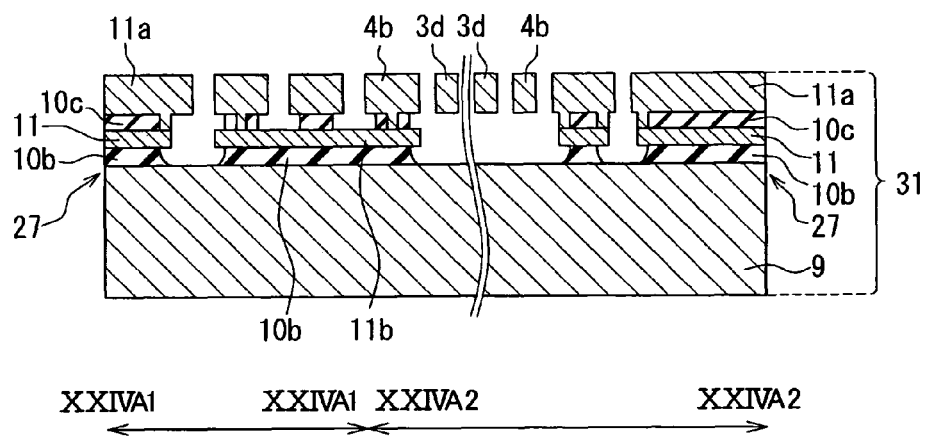
FIGS. 25A and 25B are cross sectional views showing the manufacturing method of the sensor taken along lines XXIVA1-XXIVA1 and XXIVA2-XXIVA2 in FIG. 23A.
Figure 25B:
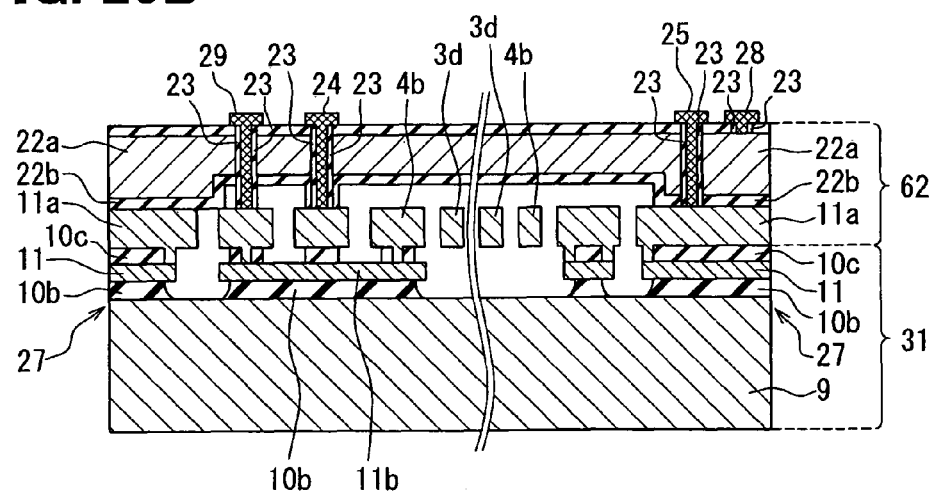

FIG. 23A is a plan view showing planar arrangement of the fixed electrode and the movable electrode. FIG. 23b is a plan view showing arrangement of the metal electrode. FIG. 25E is a cross sectional view showing the sensor taken along lines XXIVA1-XXIVA1 and XXIVA2-XXIVA2 in FIG. 23A.

As shown in FIG. 23A, an electrode 29 contacts the base portion 4a of the fixed portion 4, which is different from the base portion 4a that contacts an electrode 24. The fixed electrode 4b extends from the base portion 4a, and is arranged at a center portion between adjacent two movable electrodes 3d. Thus, the base portion 4a that contacts the electrode 29 is a region different from a region of the base portion that contacts the electrode 24.

As shown in FIG. 25E, the sensor substrate 31 includes the support substrate 9, the oxide film 10, the silicon layer 11, an oxide film 10c disposed on the silicon layer 11, and a silicon layer 11a connecting to the silicon layer 11 via an oxide film 10c. The oxide film 10c is a sacrifice oxide layer.

The oxide film 10, the silicon layer 11 and a main part of the oxide film 10c, and a main part of the silicon layer 11a are stacked in this order on the support substrate 9. The main part of the silicon layer 11a contacts the silicon layer 11 via a through hole formed in the oxide film 10c.

The silicon layer includes a silicon layer 11b for connecting to the electrode 29 electrically. The silicon layer 11b is electrically connected between a part of the silicon layer 11a and another part of the silicon layer 11a. The silicon layer 11b is arranged under the silicon layer 11a. Accordingly, the fixed electrode 4b is formed to arrange at the center portion between the adjacent movable electrodes 3d. The silicon layer 11b is made of poly silicon having the P conductive type impurity heavily doped therein.

Figure 24A:
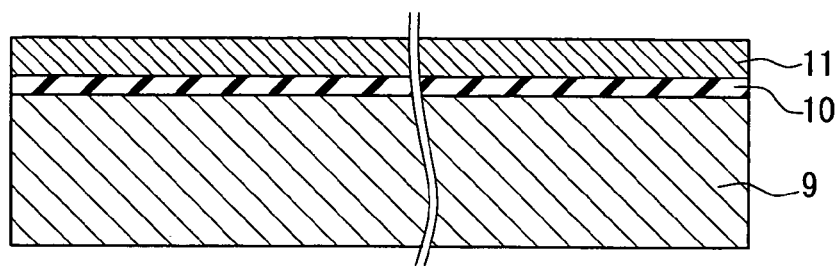
FIGS. 24A to 24C are cross sectional views showing a manufacturing method of the sensor taken along lines XXIVA1-XXIVA1 and XXIVA2-XXIVA2 in FIG. 23A.

The manufacturing method of the sensor substrate 31 will be explained as follows. As shown in FIG. 24A, the oxide film 10 is formed on the support substrate 9. The silicon layer having the P conductive type is formed on the oxide film 10. A forming method of the silicon layer 11 may be a bonding method of two silicon single crystal substrates having the P conductive type. Alternatively, poly silicon film having the P conductive type impurity heavily doped in the film may be deposited by the CVD method.

Figure 24B:
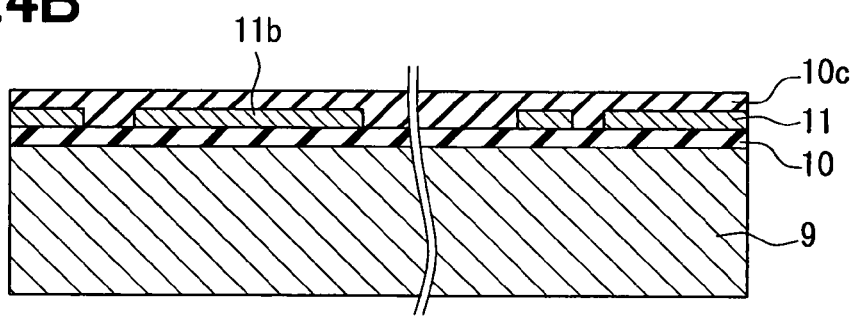

As shown in FIG. 24B, a resist is patterned on the silicon layer 11 by a photo lithography method. The silicon layer 11 is etched with using the resist, so that a part of the silicon layer 11 is removed and an opening reaches the surface of the oxide film 10. Then, the oxide film 10c is formed to cover the surface of the silicon layer 11 and the sidewall of the opening.

Figure 24C:
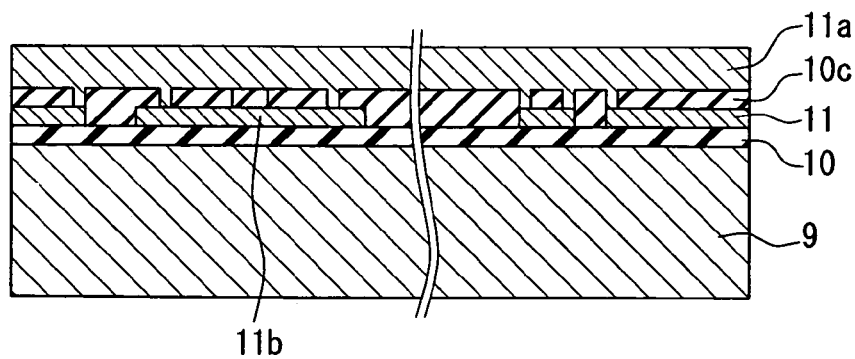

As shown in FIG. 24C, a resist (not shown) is formed and patterned on the oxide film 10c by the photo lithography method. Thus, an opening is formed in the oxide film 10c so that the opening reaches the surface of the silicon layer 11. The silicon layer 11a is formed on the oxide film 10c, and the silicon layer 11a fills in the opening.

As shown in FIG. 25D, a resist is patterned and formed on the silicon layer 11a by the photo lithography method. Then, the silicon layer 11a is etched so that a trench is formed in the silicon layer 11a. Thus, the silicon layer 11a is divided into multiple portions. Then, the oxide film 10 together with the oxide film 10c exposed from the silicon layer 11a are removed by the isotropic etching method. The oxide films 10c, 10 under the fixed electrode 4b and the movable electrode 3d are removed. Further, the support portion 10b under the electrodes 24, 29 remains, and a part of the oxide film 10 adjacent to the support portion 10b is removed. AT the same time, the support portion 10b under the periphery portion 27 remains, and the oxide film 10 adjacent to the support portion 10b is removed.

As shown in FIG. 25E, the cap substrate 22 and the sensor substrate 31 are bonded to each other. Then, the electrodes 24-26, 28-29 are formed to penetrate the cap substrate 22.

In the sixth embodiment, the sensor substrate 31 includes the fixed electrodes 4b, which are arranged on both sides of the movable electrode 3d. The capacitance change between the fixed electrode 4b and the movable electrode 3d is enlarged. Further, the sensor according to the present embodiment has substantially the same electric connection structure as that of the fifth embodiment, so that the present embodiment has the similar effect as the fifth embodiment.

Seventh Embodiment

Figure 26:
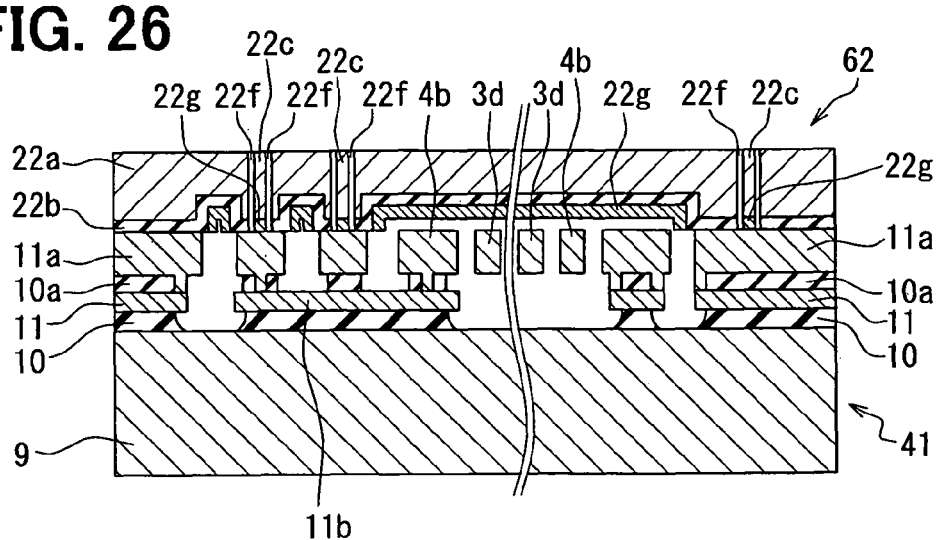
FIG. 26 is a cross sectional view showing a physical quantity sensor according to a seventh embodiment.

FIG. 26 shows a sensor according to a seventh embodiment. A through hole electrode is formed in a silicon layer in the cap substrate. Further, the air isolation structure separates the through hole electrode from other portions of the silicon layer. As shown in FIG. 26, the P conductive type silicon layer 22c and the P conductive type silicon layer 22g are formed, which are similar to FIG. 25E. The electric connection structure of the present embodiment is similar to that of the previous embodiments, so that the similar effect is obtained.

Eighth Embodiment

FIGS. 27A to 28B show a method of manufacturing a sensor according to an eighth embodiment. An electric potential of the support substrate in the sensor substrate is retrieved from the cap substrate.

Figure 28A:
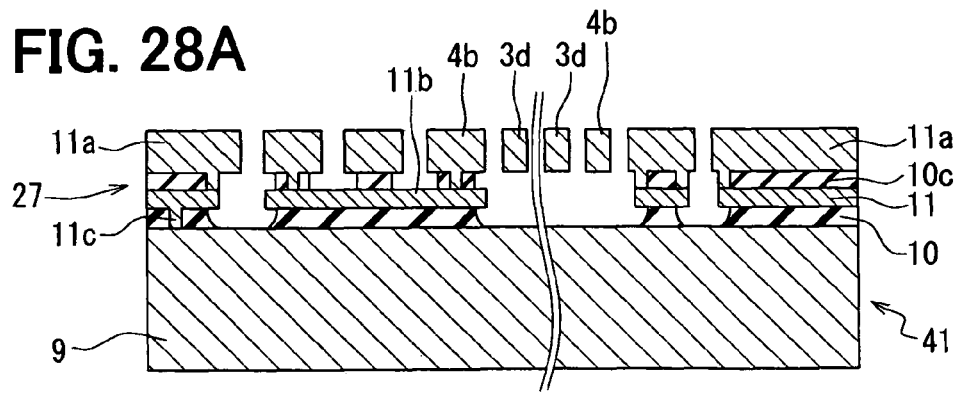
FIGS. 28A to 28B are cross sectional views showing the manufacturing method of a physical quantity sensor according to the eighth embodiment.
Figure 28B:
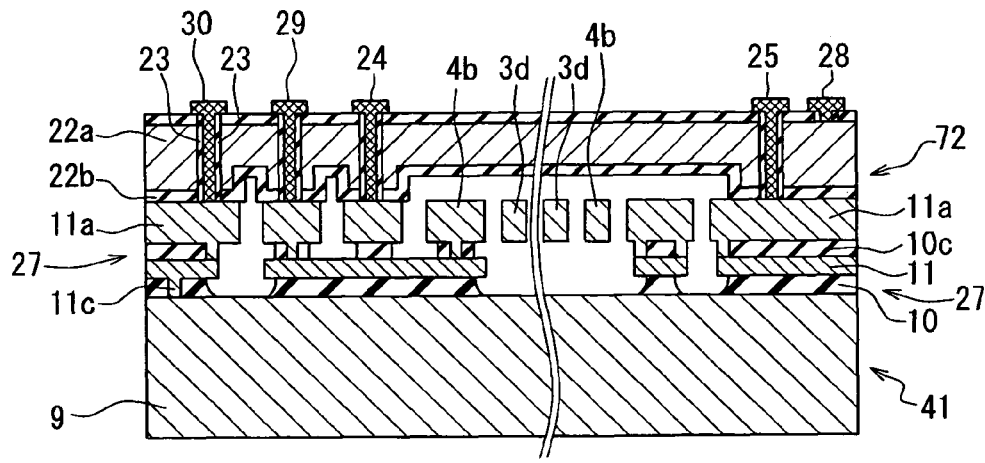

As shown in FIG. 28B, the sensor includes the sensor substrate 41. In the substrate 41, the silicon layer 11c is formed to connect between the support substrate 9 and the silicon layer 11. Further, the sensor includes the cap substrate 72, which has the electrodes 24-26, 28-29. Further, the cap substrate 72 further includes an electrode 30, which is formed on the surface of the silicon layer 11a. The silicon layer 11a contacts the silicon layer 11, which is integrated with the silicon layer 11c as a part of the sensor substrate 41. Thus, the electrode 30 protruded from the cap substrate 72 provides to retrieve the electric potential of the support substrate 9.

Figure 27A:
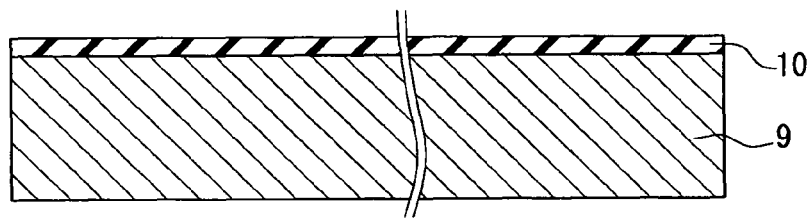
FIGS. 27A to 27C are cross sectional views showing a manufacturing method of a physical quantity sensor according to an eighth embodiment.
Figure 27B:
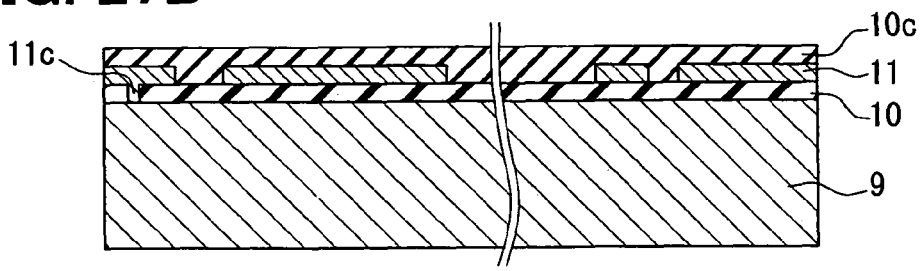

A manufacturing method of the sensor will be explained. As shown in FIG. 27A, the oxide film 10 is formed on the support substrate 9. Then, as shown in FIG. 27B, a resist (not shown) is formed on the oxide film 10 by a photo lithography method. An opening is formed on the surface of the oxide film 10 to reach the substrate 9. The silicon layer 11c is embedded in the opening. At the same time, the silicon layer 11 is formed on the oxide film 10. A resist (not shown) is patterned and formed on the silicon layer 11 by a photo lithography method. Then, the silicon layer 11 is etched so that an opening is formed to reach the surface of the oxide film 10. Then, the oxide film 10c is formed in the opening, and the oxide film 10c is formed on the silicon layer 11.

Figure 27C:
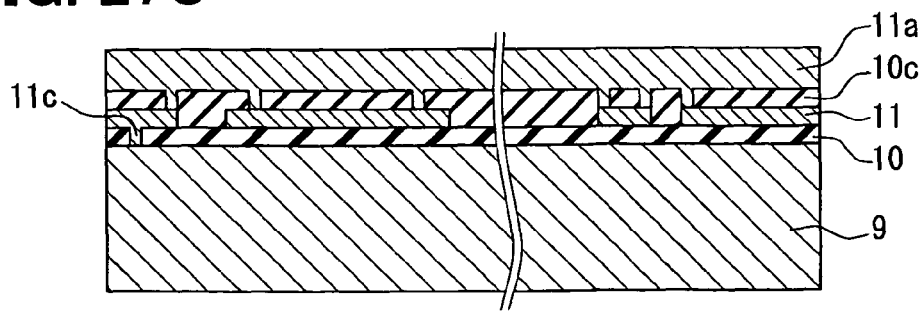

As shown in FIG. 27C, an opening is formed in the oxide film 10c. The silicon layer 11a is formed in the opening and on the oxide film 10c, so that the silicon layer 11a contacts the silicon layer 11. Then, the silicon layer 11a is flattened by the CMP method.

As shown in FIG. 28D, a resist (not shown) is patterned and formed on the silicon layer 11a by the photo lithography method. A trench is formed in the silicon layer 11a so that the silicon layer 11a is divided into multiple parts. After that, the exposed oxide film 10c and the oxide film 10 are isotropically etched, so that the oxide films 10c, 10 under the fixed electrode 4b and the movable electrode 3d is removed. Further, the support portion 10b under the anchor portion 3c remains on the substrate 9, and a part of the oxide film 10 adjacent to the support portion 10b is removed.

As shown in FIG. 28B, the cap substrate 72 and the sensor substrate 41 are bonded to each other, and the electrodes 24-26, 28-30 are formed in the cap substrate 72 to penetrate the cap substrate 72.

In this embodiment, the silicon layers 11, 11a, 11c and the support substrate 9 are made of silicon with the P conductive type impurity doped therein. Although the sensor includes no diffusion layer, the sensor provides the effect similar to that of the above embodiments. Further, the silicon layer 11c is structurally connected between the silicon layer 11 of the periphery portion 27 and the support substrate 9. Thus, the electric potential of the silicon layers 11, 11a, 11c is held to be equal to the electric potential of the support substrate 9. Accordingly, a parasitic capacitance between the movable electrode 3d of the movable portion 3 and the support substrate 9 is reduced. Thus, the sensitivity of the movable portion 3 is improved. Specifically, since the electric potentials among the electrode 30 in the cap substrate 72, the silicon layers 11a, 11 in the periphery portion 27, and the support substrate 9 are held to be constant, a noise is reduced.

Ninth Embodiment

Figure 29:
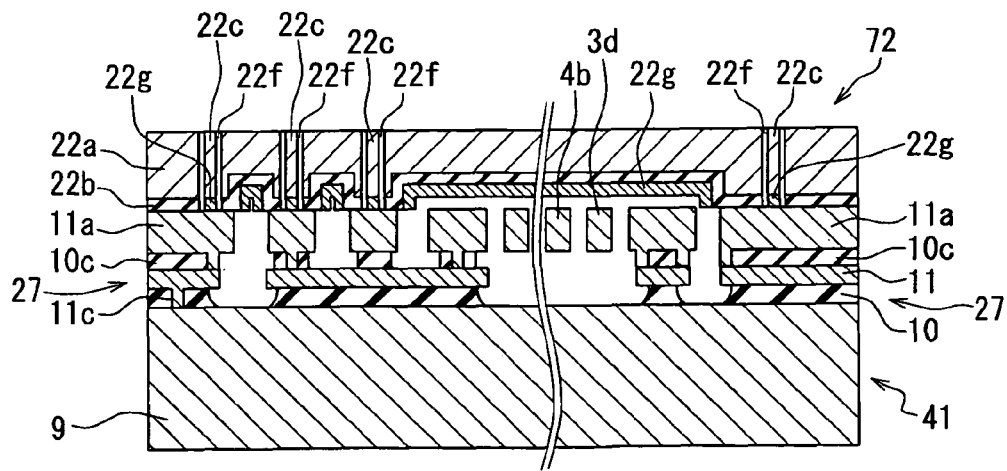
FIG. 29 is a cross sectional view showing a physical quantity sensor according to a ninth embodiment.

FIG. 29 shows a sensor according to a ninth embodiment. The through hole electrode is formed from the support substrate of the cap substrate as a main structure. Further, the air isolation structure provides to isolate the through hole electrode from other portions. In FIG. 29, the electrodes 24-25, 29-30 includes the silicon layer 22c having the P conductive type impurity doped therein and the silicon layer 22g having the P conductive type impurity doped therein, respectively. The sensor has almost the same electric connection structure so that the sensor provides almost the same effects as the above embodiments.

Tenth Embodiment

FIGS. 30A to 31B show a manufacturing method of a sensor according to a tenth embodiment. The sensor can detect capacitance change in the vertical direction. Further, a connection portion between the sensor substrate and the cap substrate is made of material, which is the same as a sensor substrate side material and a cap substrate side material. The connection portion is an independent part from the sensor substrate and the cap substrate. A film made of the same material as a connection portion of the sensor substrate is preliminarily formed on a surface of the cap substrate, to which the sensor substrate is bonded. Then, the sensor substrate structurally contacts the cap substrate.

Figure 31A:
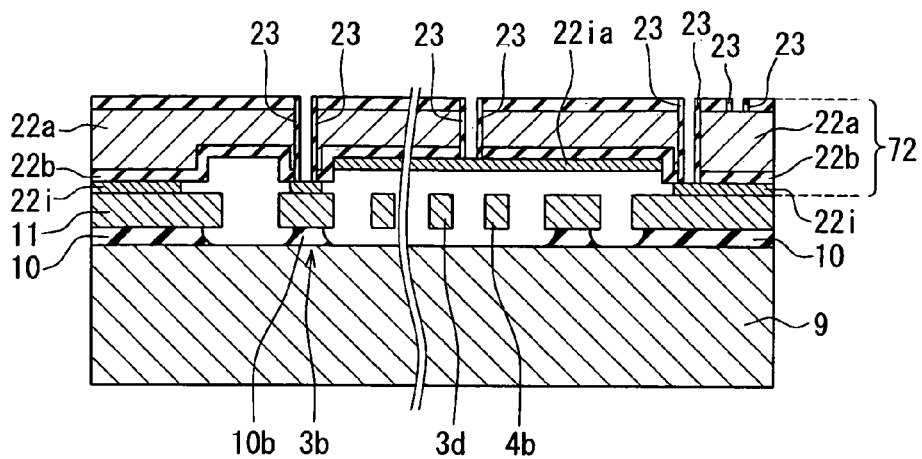
FIGS. 31A to 31B are cross sectional views showing the manufacturing method of a physical quantity sensor according to the tenth embodiment.
Figure 31B:
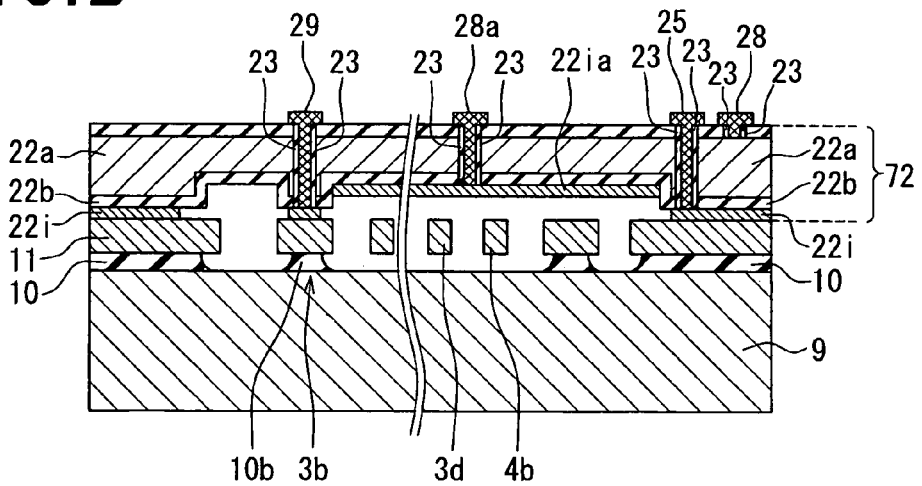

As shown in FIG. 31B, the sensor includes the cap substrate 72, which has the support substrate 22a, the insulation film 22b and a silicon layer 22i. The silicon layer 22i is formed on a part of a surface of the cap substrate 72, which contacts the sensor substrate 21.

The silicon layer 22i is made of, for example, poly silicon. The silicon layer 22i is made of the same material as the silicon layer 11. The silicon layer 22i is arranged between the electrodes 24, 25 and the silicon layer 11. The sensor includes the sensor substrate 21. Alternatively, the sensor may include the sensor substrate 31, 41.

The silicon layer 22i has a lateral extension portion 22ia, which is formed under the insulation film 22b. The lateral extension portion 22ia is disposed over the movable electrode 3d, and fixed to the cap substrate 72. When the movable electrode 3d is displaced in the vertical direction, a distance between the movable electrode 3d and the lateral extension portion 22ia is changed. Thus, displacement of the movable electrode 3d in the vertical direction is detected. An electrode 28a is formed on the lateral extension portion 22ia so that the capacitance change in the vertical direction is detected.

Figure 30A:
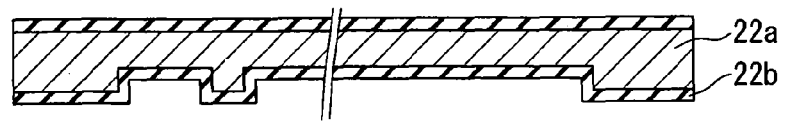
FIGS. 30A to 30C are cross sectional views showing a manufacturing method of a physical quantity sensor according to a tenth embodiment.
Figure 30B:
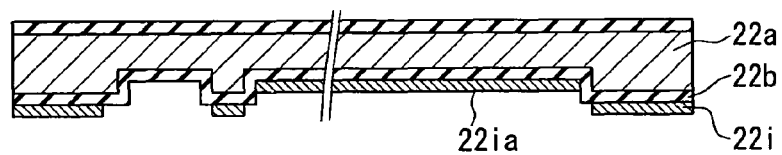

The manufacturing method of the sensor will be explained as follows. As shown in FIG. 30A, the insulation film 22b is formed along with an outer periphery of the support substrate 22a. As shown in FIG. 30B, a poly silicon film is deposited on the backside of the insulation film 22b by the CVD method. The poly silicon film is patterned by the photo lithography method, so that the poly silicon film remains on a predetermined surface of the cap substrate 72, which contacts the sensor substrate 21, and excess poly silicon film is removed.

Figure 30C:
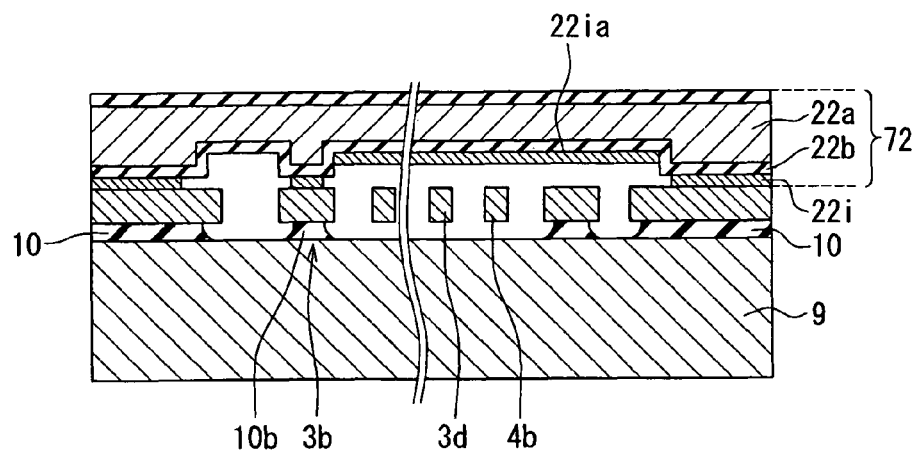

As shown in FIG. 30C, the cap substrate 72 and the sensor substrate 21 are bonded to each other. As shown in FIG. 31A, a resist (not shown) is formed and patterned on the surface of the insulation film 22b by the photo lithography method. After the insulation film 22b is etched, the support substrate 22a is etched so that a trench for forming the through hole electrode is formed in the substrate 22a. The insulation film 23 is formed on an inner wall of the trench. As shown in FIG. 31B, the electrodes 24-26, 28, 28a are formed. The forming step of the electrodes 24-26, 28, 28a is similar to the above embodiments. In the present embodiment, the electrode 28a for detecting capacitance change in the vertical direction and the silicon layer 22ia are made of silicon having the P conductive type impurity doped therein. Although the sensor includes no diffusion layer, the sensor has almost the same effect as the above embodiments. Further, the silicon layer 22ia for detecting the capacitance in the vertical direction and the silicon layer 22i for contact electrode are formed in the same process, so that the number of steps for forming the sensor is reduced.

Eleventh Embodiment

FIGS. 32A to 33B show a sensor according to an eleventh embodiment. An electric potential of a semiconductor layer in a cap substrate is retrieved from a backside of a sensor substrate.

Figure 33A:
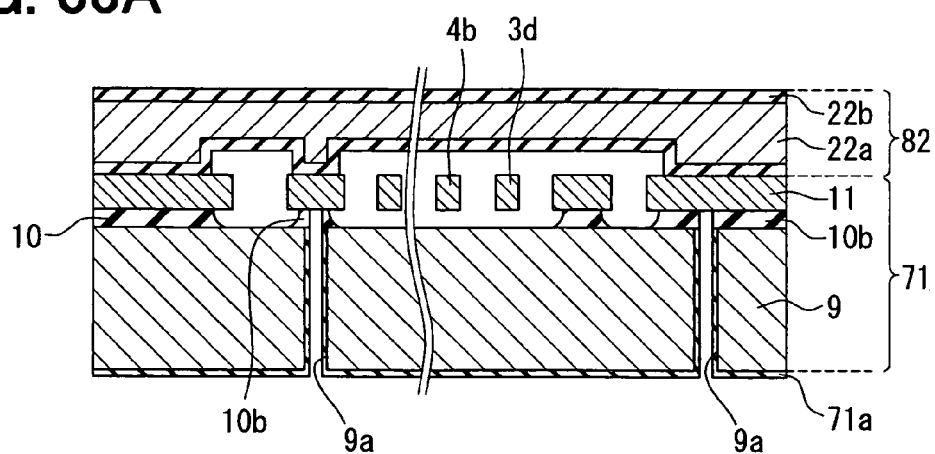
FIGS. 33A to 33B are cross sectional views showing the manufacturing method of a physical quantity sensor according to the eleventh embodiment.
Figure 33B:
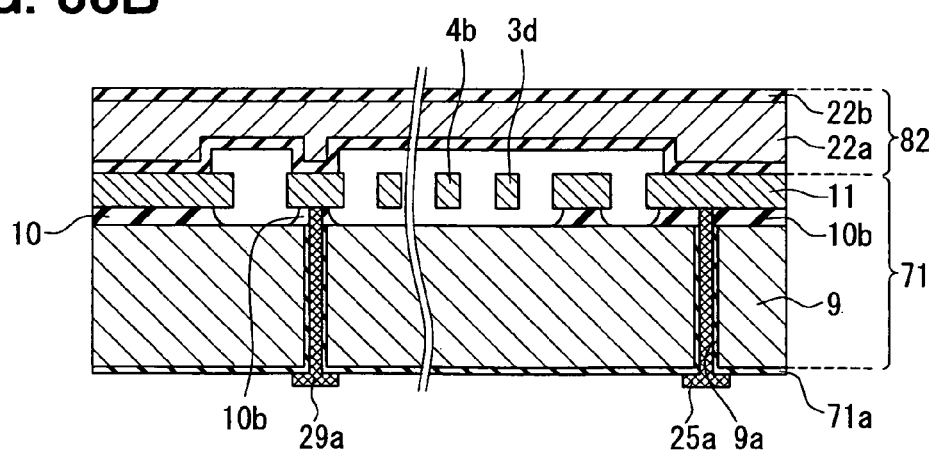

As shown in FIG. 33B, the sensor includes a sensor substrate 71, which has a support substrate 9. A through hole 9a is formed in the support substrate 9. The insulation film 71a is formed on an inner wall of the through hole 9a. The electrodes 25a, 29a are formed in the through holes via the insulation film 71a. Each electrode 25a, 29a are made of the same material as the electrode 25, 29. The electrode 25a, 29a penetrates the support substrate 9 and the support portion 10b in the insulation film 10.

The manufacturing method of the sensor will be explained as follows.

Figure 32A:
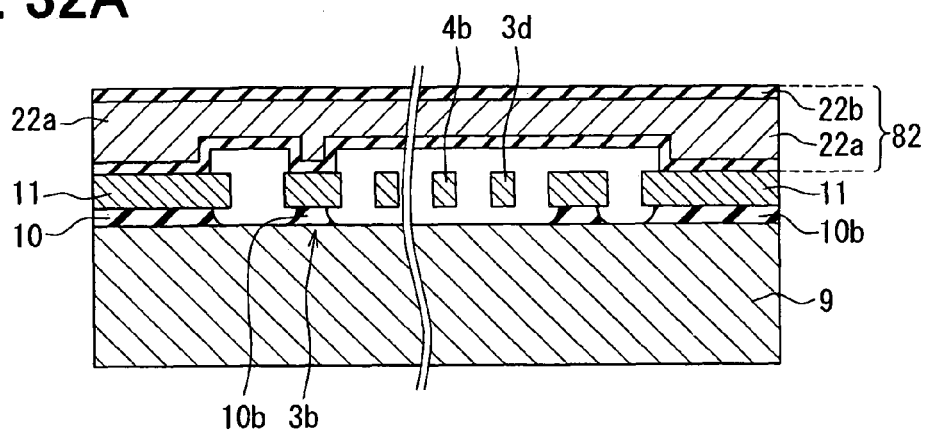
FIGS. 32A to 32C are cross sectional views showing a manufacturing method of a physical quantity sensor according to an eleventh embodiment.
Figure 32B:
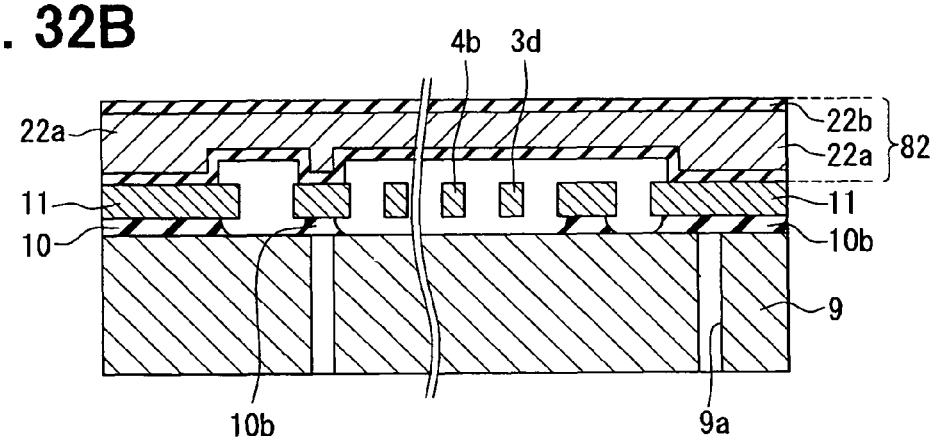
Figure 32C:
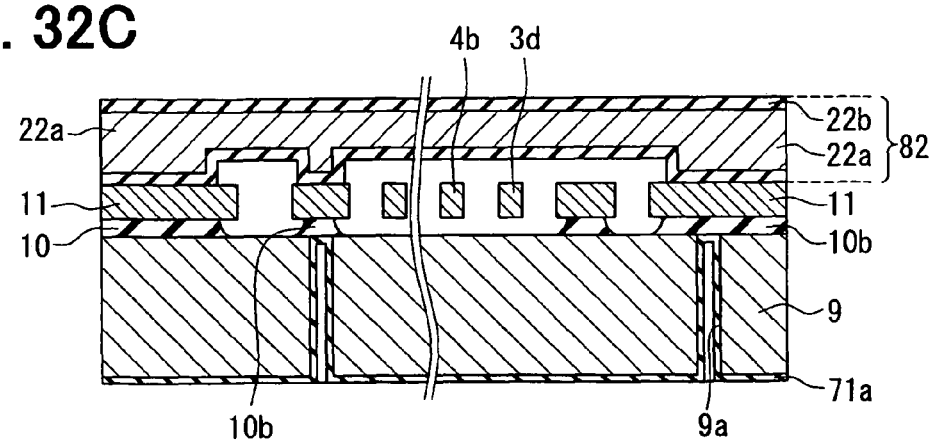

As shown in FIG. 13A, when the cap substrate is bonded to the sensor substrate, a structure shown in FIG. 32A is obtained. After that, as shown in FIG. 32B, a resist (not shown) is formed and patterned on the bottom of the support substrate by the photo lithography method. The through hole 9a is formed from the bottom of the support substrate 9 to the support portion 10b in the oxide film 10. After that, as shown in FIG. 32C, the insulation film 71a is formed on the bottom of the support substrate 9 and the inner wall of the through hole 9a by the thermal treatment or the CVD method.

As shown in FIG. 33A, the through hole 9a is formed in a top end of the insulation film 71a, which contacts the oxide film 10b and arranged on the inner wall of the through hole 9a. Further, the through hole 9a is formed in the support portion 10b of the oxide film 10, so that the through hole 9a reaches the silicon layer 11. Next, as shown in FIG. 33B, the electrodes 25a, 29a are embedded in the through hole 9a. Thus, the electric potential of the silicon layer 11 is retrieved from the backside of the sensor substrate 71. Thus, the degree of freedom for arrangement of wirings is increased.

Twelfth Embodiment

FIGS. 34A to 34D show a method of manufacturing a sensor according to a twelfth embodiment. The through hole electrode is made of the same material as the support substrate in the sensor substrate. Further, the air isolation structure provides to isolate from other portion of the support substrate.

Figure 34A:
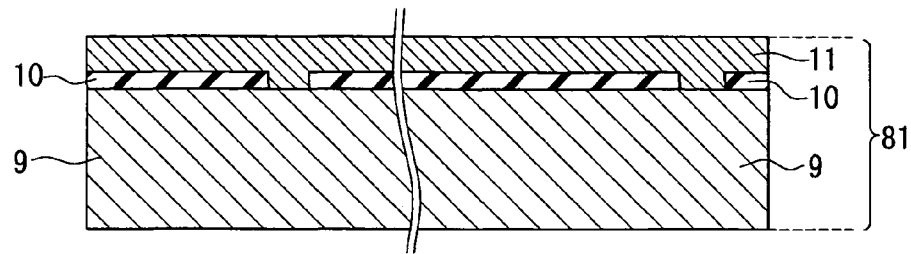
FIGS. 34A to 34D are cross sectional views showing a manufacturing method of a physical quantity sensor according to a twelfth embodiment.
Figure 34B:
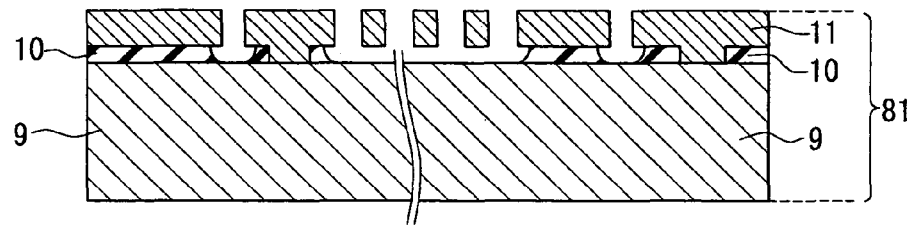

As shown in FIG. 34A, the oxide film 10 is formed on the surface of the support substrate 9. The through hole is formed in the oxide film 10. The silicon layer 11 is formed in the through hole by the CVD method so that the silicon layer 11 contacts the surface of the support substrate 9. Then, the silicon layer 11 is flattened by the CMP method. Next, as shown in FIG. 34B, a resist is formed and patterned on the silicon layer 11 by the photo lithography method. By using the resist as a mask, the silicon layer 11 is anisotropically etched by the RIE method or the like. Then, the oxide film 10 as a sacrifice layer is isotropically etched.

Figure 34C:
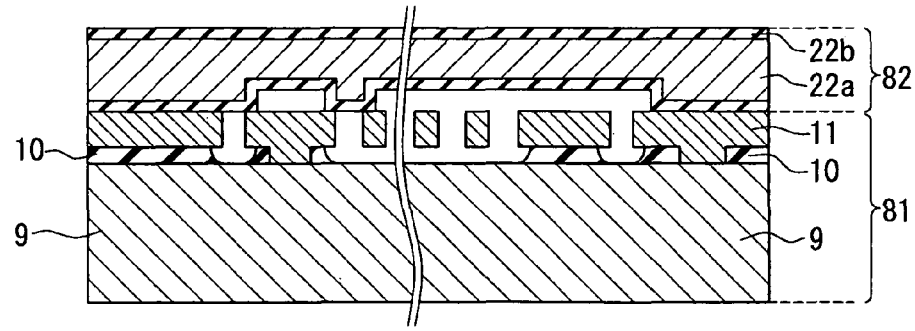
Figure 34D:
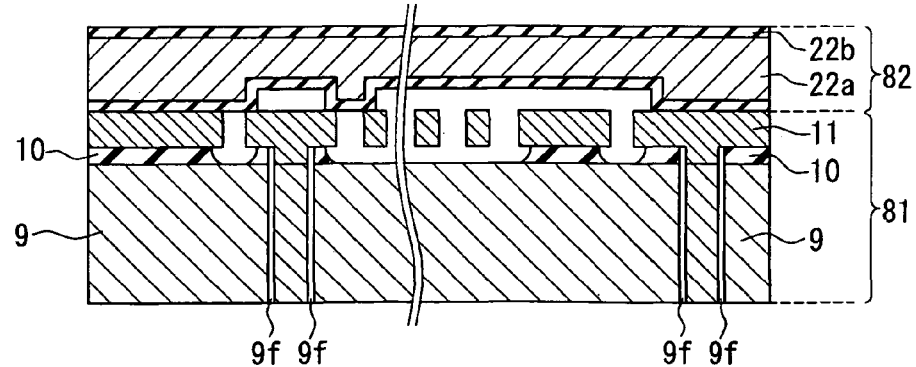

As shown in FIG. 34C, the cap substrate 82 is bonded to the sensor substrate 81. A resist (not shown) is formed and patterned on the bottom of the sensor substrate 81 by the photo lithography method. As shown in FIG. 34D, the trench (i.e., the through hole) 9f is formed in the embedded region of the support substrate 9 and the silicon layer 11 by the anisotropic etching method, so that the air isolation structure is formed. The electric potential of the silicon layer 11 is retrieved from the bottom of the sensor substrate 81.

Thirteenth Embodiment

FIGS. 35 to 37B show a sensor according to a thirteenth embodiment. The physical quantity sensor is a pressure sensor for detecting pressure applied to a diaphragm with using a strain gauge.

Figure 35:
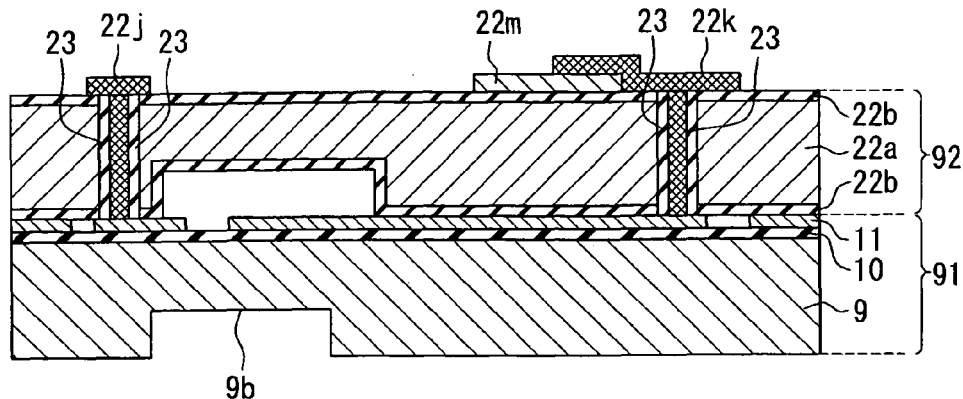
FIG. 35 is a cross sectional view showing a pressure sensor having a strain gauge according to a thirteenth embodiment.

FIG. 35 shows the pressure sensor having the strain gauge and the diaphragm.

The sensor includes the sensor substrate 91 having a SOI substrate. The SOI substrate includes the support substrate 9, an insulation film and the silicon layer 11, which are stacked in this order. The support substrate 9 has the diaphragm 9 as a membrane, which is provided by thinning a part of the substrate 9. The silicon layer 11 having the P conductive type impurity doped therein is formed on the support substrate 9 via the oxide film 10. The silicon layer 11 functions as a strain gauge resistor (i.e., Piezo resistor element). When pressure is applied to the diaphragm 9b, strain is generated in the diaphragm 9b and the silicon layer 11 as the Piezo resistor element. When the pressure along with a predetermined direction is applied, the resistance of the Piezo resistor element changes.

The pressure sensor includes the cap substrate 92 having through hole electrodes 22j, 22k. Each through hole electrode 22j, 22k is formed from a metal electrode such as aluminum or a semiconductor electrode such as P conductive type silicon. A strain signal from the silicon layer 11 is retrieved from the through hole electrodes 22j, 22k. Further, a thin film resistor 22m is formed on the surface of the cap substrate 92 so that a detection circuit is formed.

A manufacturing method of the sensor will be explained as follows.

Figure 36A:
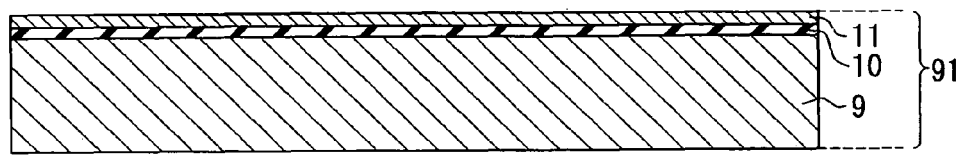
FIGS. 36A to 36D are cross sectional views showing a manufacturing method of the pressure sensor according to the thirteenth embodiment.

As shown in FIG. 36A, the silicon layer 11 having the P conductive type is formed on the support substrate 9 made of P conductive type silicon via the oxide film 10. In this case, the SOI structure having the P conductive type or the poly silicon film having the P conductive type impurity doped therein is deposited, so that a structure shown in FIG. 36A is obtained.

Figure 36B:
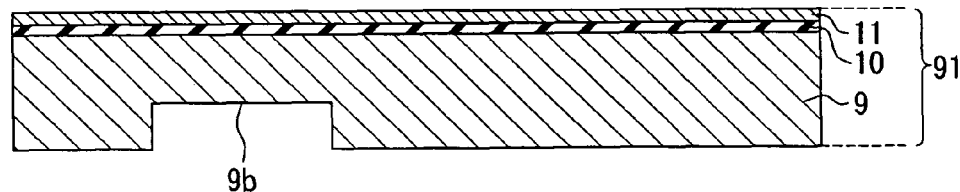

As shown in FIG. 36B, a resist (not shown) is formed and patterned on the backside of the support substrate 9 by the photo lithography method. A part of the support substrate 9 is etched and thinned from the backside of the support substrate 9 so that the diaphragm 9b is obtained.

Figure 36C:
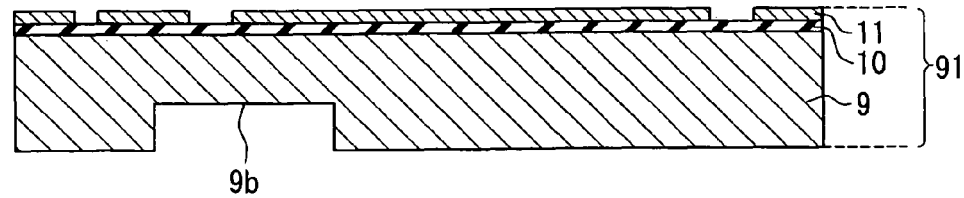

As shown in FIG. 36C, an opening having a predetermined shape is formed in the silicon layer 11 so that a part of the Piezo resistor element is obtained. A wiring arranging on the oxide film 10 may be formed at the same time by processing the silicon layer 11.

Figure 36D:
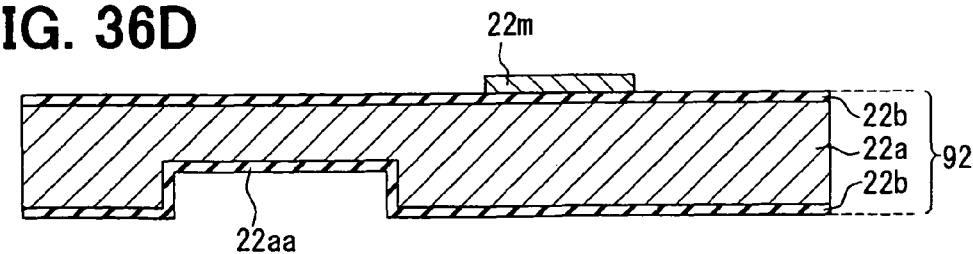

As shown in FIG. 36D, a concavity 22aa is formed on the bottom of the support substrate 22a in the sensor substrate 92. The insulation film 22b is formed on the concavity 22aa so that the concavity 22aa provides a vacuum chamber. Then, the thin film resistor 22m is formed on the surface of the insulation film 22b.

Figure 37A:
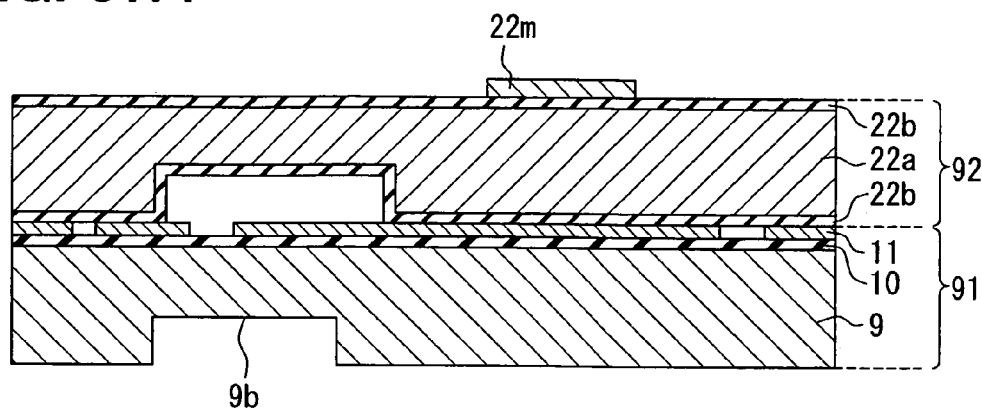
FIGS. 37A to 37B are cross sectional views showing the manufacturing method of the pressure sensor according to the thirteenth embodiment.
Figure 37B:
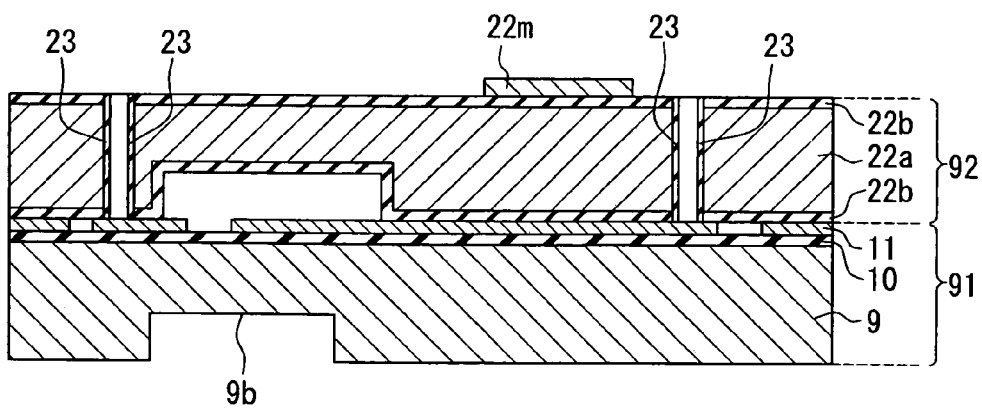

As shown in FIG. 37A, the sensor substrate 91 is bonded to the cap substrate 92. As shown in FIG. 37B, a resist is, formed and patterned on the oxide film 22b by the photo lithography method. A through hole is formed with using the resist as a mask. Then, an insulation film is formed on the inner wall of the through hole. Next, as shown in FIG. 35, the through hole electrodes 22j, 22k are embedded in the through holes so that the through hole electrode 22k contacts the thin film resistor 22m. Thus, in the present embodiment, the pressure sensor having the strain gauge is completed.

Fourteenth Embodiment

FIGS. 38A to 39C show a sensor according to a fourteenth embodiment. The sensor is a capacitive pressure for detecting pressure applied to the diaphragm with capacitance change.

Figure 39A:
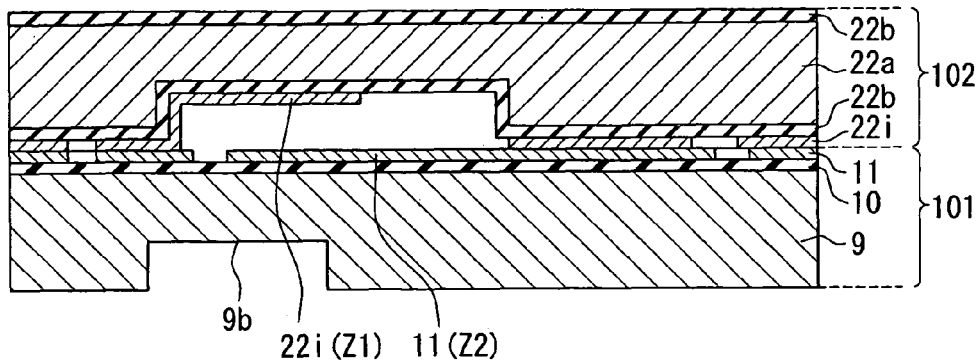
FIGS. 39A to 39C are cross sectional views showing the manufacturing method of the capacitive pressure sensor according to the fourteenth embodiment.
Figure 39B:
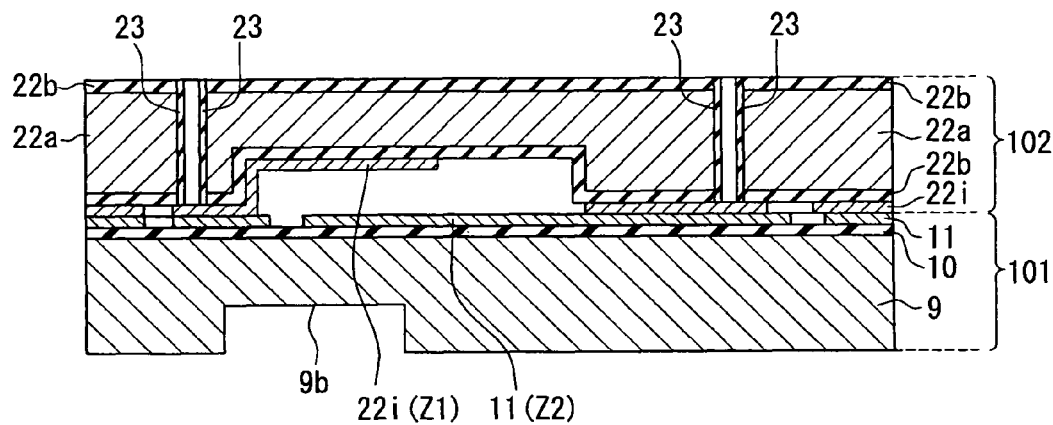
Figure 39C:
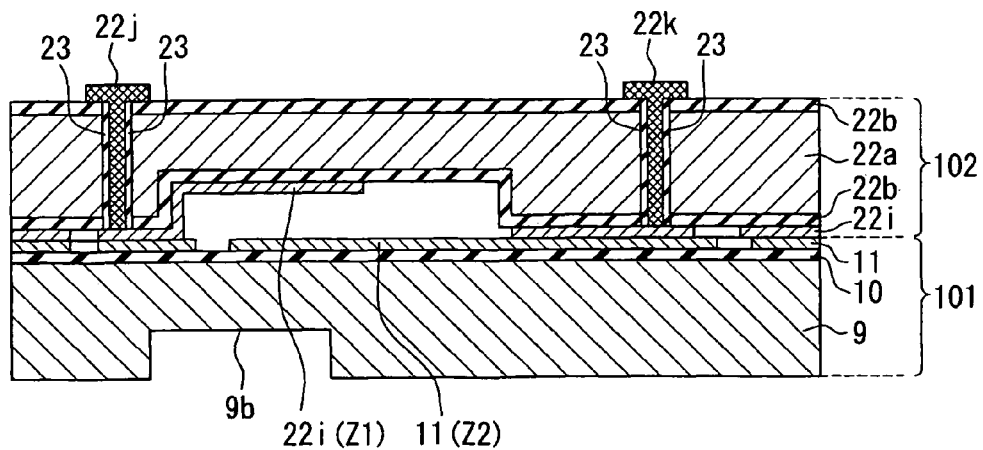

As shown in FIG. 39C, the sensor includes the sensor substrate 101 having the diaphragm 9b, which is disposed on the bottom of the support substrate 9. The silicon layer 11 is formed on the surface of the support substrate 9 via the oxide film 10. A part of the silicon layer 11 disposed over the diaphragm 9b and extending in the lateral direction functions as one electrode Z2 for detecting the capacitance change.

The sensor further includes the cap substrate 102. The through hole electrodes 22j, 22k are formed in the cap substrate 102. The silicon layer 22i is formed on the outer surface of the insulation film 22b. The silicon layer 22i extends in the lateral direction so that the silicon layer 22i covers the outer surface of the insulation film 22b disposed on the concavity 22aa of the support substrate 22a. A part of the silicon layer 22i functions as the other electrode Z1, which faces the electrode Z2. The part of the silicon layer 22i is arranged on the concavity 22aa. The silicon layer 11 of the electrode Z2 is separated from the silicon layer 22i of the electrode Z1.

The through hole electrode 22j contacts the electrode Z1, which is formed on the silicon layer 22i. The through hole electrode 22k contacts the electrode Z2 via the silicon layer 22i, which is independently arranged. The electric potential of the electrode Z1 is retrieved from the through hole electrode 22j. The electric potential of the through hole electrode 22k is retrieved from the electrode Z2. Accordingly, a distance between the electrodes Z1, Z2 changes so that a capacitance between the electrodes Z1, Z2 is changed. Thus, the pressure applied to the diaphragm 9b is detected with the through hole electrodes 22j, 22k.

A manufacturing method of the sensor will be explained as follows.

Figure 38A:
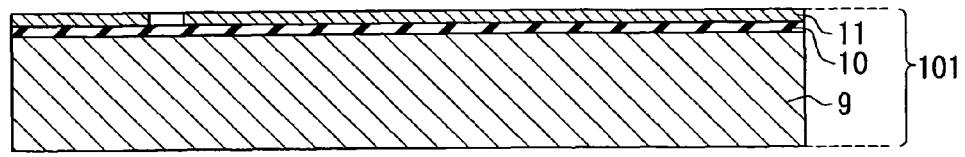
FIGS. 38A to 38E are cross sectional views showing a manufacturing method of a capacitive pressure sensor according to a fourteenth embodiment.
Figure 38B:
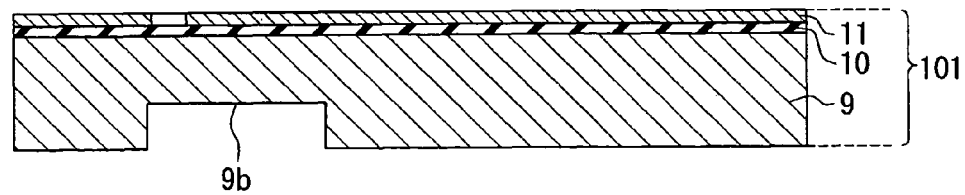
Figure 38C:
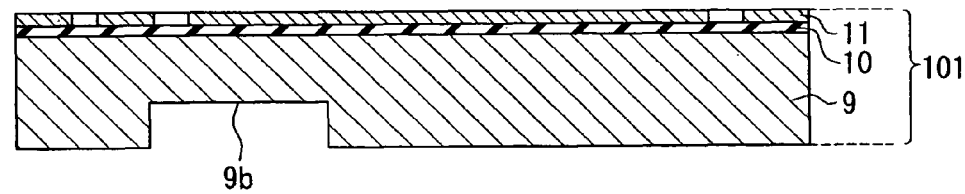

As shown in FIG. 38A, in the sensor substrate 101, the support substrate is formed on the silicon layer 11 via the insulation film 10. As shown in FIG. 38B, the diaphragm 9b is formed and patterned on the bottom of the support substrate 9 by the photo lithography method. As shown in FIG. 38C, the silicon layer 11 is formed and patterned on the top of the silicon layer 11 by the photo lithography method.

Figure 38D:
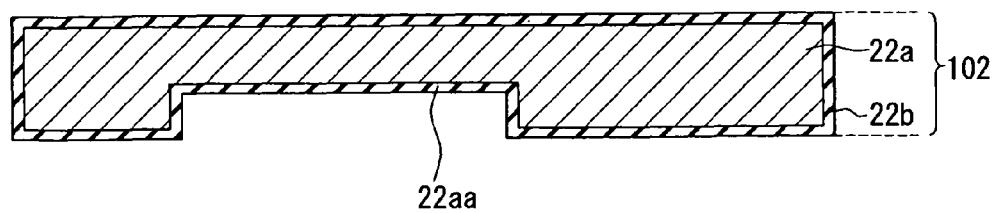
Figure 38E:
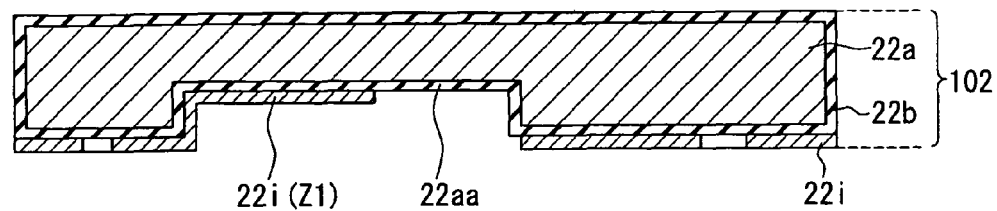

In the cap substrate 102, as shown in FIG. 38D, the concavity 22aa is formed on the support substrate 22a. Then, the insulation film 22b is formed on a whole surface of the support substrate 22a. Next, as shown in FIG. 38E, the silicon layer 22i is deposited on the bottom of the insulation film 22b by the CVD method. The silicon layer 22i is etched and patterned to be a predetermined shape. The silicon layer 22i covers the insulation film 22b on the concavity 22aa. The silicon layer 22i extends in the lateral direction. A part of the silicon layer 22i extending in the lateral direction functions as the electrode Z1. The electrode Z1 is electrically isolated. Other parts of the silicon layer 22i, which is independent from the electrode Z1, is formed on the bottom of the insulation film 22b, and functions as a conductive film.

As shown in FIG. 39A, the top of the sensor substrate 101 and the bottom of the cap substrate 102 are bonded so that the silicon layer 11 and the silicon layer 22i are bonded to each other. In this case, the electrode Z1 of the silicon layer 22i and the electrode Z2 of the silicon layer 11 are separated from each other.

Next, as shown in FIG. 39B, a through hole is formed in the support substrate 22a and the insulation film 22b. After the insulation film 23 is formed on the inner wall of the through hole, a hole is formed in the cap substrate 102 to reach the surface of the silicon layer 22i by using the photo lithography method. Next, as shown in FIG. 39C, the through hole electrodes 22j, 22k are formed in the hole via the insulation film 23.

In the present embodiment, the pressure applied to the diaphragm is detected based on the capacitance change, so that the capacitive pressure sensor is completed.

Other Embodiments

The anchor portion 3c of the P conductive type silicon layer 11 and the insulation film 10 under the anchor portion 3c are described in the above embodiments. Alternatively, the silicon layer 11 other than the anchor portion 3c and the insulation film 10 under the silicon layer 11 may be formed in the same manner.

The support substrate 9, 22a and the silicon layer 11, 11a, 11c made of P conductive type silicon includes a connection portion with an electric conductive element, in which an impurity is heavily doped.

The physical quantity sensor is the acceleration sensor. Alternatively, the sensor may be a yaw rate sensor for detecting physical quantity based on the capacitance between multiple electrodes, which are separated from each other.

The above disclosure has the following aspects.

According to a first aspect of the present disclosure, a physical quantity sensor includes: a sensor substrate including a first support substrate, a first insulation film and a first semiconductor layer, which are stacked in this order, wherein the first support substrate has a P conductive type impurity doped therein, the first insulation film has a P conductive type impurity doped therein, and the first semiconductor layer has a P conductive type impurity doped therein; a cap substrate including a second support substrate, which is disposed on the first semiconductor layer, and has a P conductive type impurity doped therein; and a plurality of electrodes, which are separated from each other. The physical quantity is detected based on a capacitance between the plurality of electrodes, and the plurality of electrodes is disposed in the first semiconductor layer.

The above sensor has wide resistivity without a diffusion layer so that the sensor can detect the physical quantity with high accuracy.

Alternatively, the second support substrate may include a through hole electrode, which penetrates the cap substrate. The electric potential of the first semiconductor layer is easily retrieved from the through hole electrode. Further, the second support substrate may be made of semiconductor, and the through hole electrode may have a main structure, which is made from the second support substrate. The through hole electrode is easily formed. Further, the through hole electrode may be separated from other portions of the second support substrate with a groove so that an air isolation structure is provided. A parasitic capacitance between the through hole electrode and the other portions of the second support substrate is reduced. Furthermore, the second support substrate may be made of semiconductor. The cap substrate further includes a second insulation film. The second support substrate is covered with the second insulation film. The second support substrate includes a concavity, which is covered with the second insulation film. The groove penetrates the second support substrate, and reaches the second insulation film disposed on the concavity. The depth of the through hole in the second support substrate becomes small, so that the manufacturing cost of the sensor is reduced. Further, the second support substrate may be made of semiconductor. The cap substrate further includes a second insulation film and a second layer. The second support substrate is covered with the second insulation film. The second layer is made of material, which is different from the second insulation film. The second support substrate includes a concavity, which is covered with the second insulation film. The second layer covers the second insulation film, and the groove penetrates the second support substrate, and reaches the second insulation film disposed on the concavity so that an air isolation structure is provided. Thus, the second insulation film and the second layer provide a two-layered structure, so that air-tightness is improved. Further, the second insulation film may include a vertical extending portion, which is perpendicular to the cap substrate. The vertical extending portion is disposed on a sidewall of the concavity, and the groove reaches the vertical extending portion. In this case, the air-tightness is much improved.

Alternatively, the cap substrate may include an electrolytic plating portion, which is disposed between the first semiconductor layer and the second support substrate. Alternatively, the sensor substrate may further include a first film, which is disposed between the first semiconductor layer and the second support substrate. The first semiconductor layer is made of a material, which is the same as a material of the second support substrate, and the first film is made of a material, which is the same as a material of the second support substrate. In this case, connection between the first semiconductor layer and the second support substrate is improved so that electric resistance of the connection is reduced.

Alternatively, the cap substrate may further include a metal electrode, which is disposed on the second support substrate.

According to a second aspect of the present disclosure, a physical quantity sensor includes: a support substrate; an insulation film disposed on the support substrate; a first electrode, which is movable, and disposed over the support substrate; and a second electrode disposed on the insulation film. The insulation film has a P conductive type impurity doped therein. The insulation film includes a sidewall, which is curved downwardly. The insulation film has a width along with a direction parallel to the support substrate. The width of the insulation film becomes narrower as it goes from the support substrate to the second electrode. The first electrode is made of P conductive type silicon. The first electrode and the second electrode are separated from each other, and the physical quantity is detected based on a capacitance between the first electrode and the second electrode. In the sensor, stress concentration is reduced, so that mechanical reliability is improved. Further, distortion ratio in accordance with temperature change is improved.

Alternatively, each of the first electrode and the second electrode may have a resistivity in a range between 0.1 Ω·cm and 0.01 Ω·cm.

According to a third aspect of the present disclosure, a method for manufacturing a physical quantity sensor includes: forming a sensor substrate including a first support substrate, a first insulation film and a first semiconductor layer, which are stacked in this order, wherein the first support substrate has a P conductive type impurity doped therein, the first insulation film has a P conductive type impurity doped therein, and the first semiconductor layer has a P-conductive type impurity doped therein; forming a cap substrate including a second support substrate, which is disposed on the first semiconductor layer, and has a P conductive type impurity doped therein; and forming a plurality of electrodes in the first semiconductor layer. The plurality of electrodes are separated from each other, and the physical quantity is detected based on a capacitance between the plurality of electrodes. In this case, the above sensor has wide resistivity without a diffusion layer so that the sensor can detect the physical quantity with high accuracy. Further, the manufacturing method is simplified.

According to a fourth aspect of the present disclosure, a method for manufacturing a physical quantity sensor includes: forming an insulation film on a support substrate, wherein the insulation film has a P conductive type impurity doped therein; forming a semiconductor layer on the insulation film so that a sensor substrate is formed; dividing the semiconductor layer into a plurality of parts with a hole so that the insulation film is exposed from the semiconductor layer via the hole, wherein the plurality of parts include a first electrode having a first width and a second electrode having a second width, which is wider than the first width; and isotropically etching the insulation film via the opening so that the insulation film under the first electrode is removed, and the insulation film under the second electrode is partially removed. The physical quantity is detected based on a capacitance between the first electrode and the second electrode. The insulation film under the second electrode includes a support portion for supporting the second electrode on the support substrate, and a part of the insulation film adjacent to the support portion is removed in the isotropically etching the insulation film. In the sensor, stress concentration is reduced, so that mechanical reliability is improved. Further, distortion ratio in accordance with temperature change is improved.

Alternatively, the method may further include: forming an aluminum film on the semiconductor layer; and patterning the aluminum film to be an electrode pad by a wet etching method. In this case, the aluminum film is etched without using aqua regia. Here, when the aqua regia is used for etching a gold wire, the sensor substrate may be deteriorated. Thus, when the aluminum film is patterned, it is not necessary to use the aqua regia, so that the sensor substrate is not deteriorated.

Further, the semiconductor layer may be made of P conductive type silicon having an impurity concentration, which is equal to or higher than a predetermined value. In this case, the P conductive type silicon and the aluminum electrode provide ohmic contact.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A physical quantity sensor comprising:
    a sensor substrate including a first support substrate, a first insulation film and a first semiconductor layer, which are stacked in this order, wherein the first support substrate has a P conductive type impurity doped therein, the first insulation film has a P conductive type impurity doped therein, and the first semiconductor layer has a P conductive type impurity doped therein;
    a cap substrate including a second support substrate, which is disposed on the first semiconductor layer, and has a P conductive type impurity doped therein; and
    a plurality of electrodes, which are separated from each other,
    wherein physical quantity is detected based on a capacitance between the plurality of electrodes, and
    wherein the plurality of electrodes is disposed in the first semiconductor layer.

2. The physical quantity sensor according to claim 1,
    wherein the second support substrate includes a through hole electrode, which penetrates the cap substrate.

3. The physical quantity sensor according to claim 2,
    wherein the second support substrate is made of semiconductor, and
    wherein the through hole electrode has a main structure, which is made from the second support substrate.

4. The physical quantity sensor according to claim 2,
    wherein the through hole electrode is separated from other portions of the second support substrate with a groove so that an air isolation structure is provided.

5. The physical quantity sensor according to claim 4,
    wherein the second support substrate is made of semiconductor,
    wherein the cap substrate further includes a second insulation film,
    wherein the second support substrate is covered with the second insulation film,
    wherein the second support substrate includes a concavity, which is covered with the second insulation film, and
    wherein the groove penetrates the second support substrate, and reaches the second insulation film disposed on the concavity.

6. The physical quantity sensor according to claim 4,
    wherein the second support substrate is made of semiconductor,
    wherein the cap substrate further includes a second insulation film and a second layer,
    wherein the second support substrate is covered with the second insulation film,
    wherein the second layer is made of material, which is different from the second insulation film,
    wherein the second support substrate includes a concavity, which is covered with the second insulation film,
    wherein the second layer covers the second insulation film, and
    wherein the groove penetrates the second support substrate, and reaches the second insulation film disposed on the concavity so that an air isolation structure is provided.

7. The physical quantity sensor according to claim 5,
    wherein the second insulation film includes a vertical extending portion, which is perpendicular to the cap substrate,
    wherein the vertical extending portion is disposed on a sidewall of the concavity, and
    wherein the groove reaches the vertical extending portion.

8. The physical quantity sensor according to claim 1,
    wherein the cap substrate includes an electrolytic plating portion, which is disposed between the first semiconductor layer and the second support substrate.

9. The physical quantity sensor according to claim 1,
    wherein the sensor substrate further includes a first film, which is disposed between the first semiconductor layer and the second support substrate, wherein the first semiconductor layer is made of a material, which is the same as a material of the second support substrate, and wherein the first film is made of a material, which is the same as a material of the second support substrate.

10. The physical quantity sensor according to claim 1, wherein the cap substrate further includes a metal electrode, which is disposed on the second support substrate.

11. A physical quantity sensor comprising:

a support substrate;

an insulation film disposed on the support substrate;

a first electrode, which is movable, and disposed over the support substrate; and a second electrode disposed on the insulation film, wherein the insulation film has a P conductive type impurity doped therein, wherein the insulation film includes a sidewall, which is curved downwardly, wherein the insulation film has a width along with a direction parallel to the support substrate, wherein the width of the insulation film becomes narrower as it goes from the support substrate to the second electrode, wherein the first electrode is made of P conductive type silicon, wherein the first electrode and the second electrode are separated from each other, and wherein the physical quantity is detected based on a capacitance between the first electrode and the second electrode.

12. The physical quantity sensor according to claim 11, wherein each of the first electrode and the second electrode has a resistivity in a range between 0.1 $\Omega \cdot$cm and 0.01 $\Omega \cdot$cm.

* * * * *